(12) United States Patent
Han et al.

(10) Patent No.: US 9,865,800 B2
(45) Date of Patent: *Jan. 9, 2018

(54) MAGNETIC MEMORY DEVICES

(71) Applicant: Samsung Electronics Co., Ltd., Suwon-si, Gyeonggi-do (KR)

(72) Inventors: Shinhee Han, Seongnam-si (KR); Kilho Lee, Hwaseong-si (KR); Yoonjong Song, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/404,325

(22) Filed: Jan. 12, 2017

(65) Prior Publication Data

US 2017/0125666 A1 May 4, 2017

Related U.S. Application Data

(63) Continuation of application No. 14/964,251, filed on Dec. 9, 2015, now Pat. No. 9,691,816.

(30) Foreign Application Priority Data

Jan. 22, 2015 (KR) ........................ 10-2015-0010619

(51) Int. Cl.
| | |
|---|---|
| *H01L 27/22* | (2006.01) |
| *H01L 43/02* | (2006.01) |
| *H01L 43/08* | (2006.01) |
| *G11C 11/16* | (2006.01) |

(52) U.S. Cl.
CPC ............ *H01L 43/02* (2013.01); *G11C 11/161* (2013.01); *H01L 27/226* (2013.01); *H01L 43/08* (2013.01); *H01L 27/224* (2013.01)

(58) Field of Classification Search
CPC .... H01L 27/222; H01L 27/224; H01L 27/226
See application file for complete search history.

(56) References Cited

U.S. PATENT DOCUMENTS

| | | |
|---|---|---|
| 6,930,911 B2 | 8/2005 | Ezaki et al. |
| 7,034,348 B2 | 4/2006 | Ohba et al. |
| 7,442,602 B2 | 10/2008 | Park et al. |
| 7,556,869 B2 | 7/2009 | Fukushima et al. |
| 7,935,564 B2 | 5/2011 | Breitwisch et al. |
| 8,080,471 B2 | 12/2011 | Liaw et al. |
| 8,084,760 B2 | 12/2011 | Lung et al. |
| 8,120,946 B2 | 2/2012 | Kanakasapathy et al. |
| 8,728,859 B2 | 5/2014 | Breitwisch et al. |
| 8,772,888 B2 | 7/2014 | Jung et al. |
| 8,779,408 B2 | 7/2014 | Lee et al. |
| 8,830,742 B2 | 9/2014 | Kondo et al. |
| 2005/0006682 A1 | 1/2005 | Bae et al. |
| 2008/0278995 A1 | 11/2008 | Ho |
| 2010/0181633 A1 | 7/2010 | Nam et al. |
| 2011/0062536 A1 | 3/2011 | Min et al. |

(Continued)

*Primary Examiner* — Thao P Le

(74) *Attorney, Agent, or Firm* — Myers Bigel, P.A.

(57) ABSTRACT

Magnetic memory devices are provided. A magnetic memory device includes a Magnetic Tunnel Junction (MTJ) structure on a contact. Moreover, the magnetic memory device includes an insulating structure and an electrode between the MTJ structure and the contact. In some embodiments, a first contact area of the electrode with the MTJ structure is smaller than a second contact area of the insulating structure with the MTJ structure.

20 Claims, 34 Drawing Sheets

(56) References Cited

U.S. PATENT DOCUMENTS

| | | |
|---|---|---|
| 2011/0249485 A1* | 10/2011 | Fujita ................. G11C 11/16 |
| | | 365/148 |
| 2013/0037895 A1 | 2/2013 | Lee et al. |
| 2013/0119494 A1 | 5/2013 | Li et al. |
| 2015/0035096 A1 | 2/2015 | Han et al. |
| 2015/0325622 A1 | 11/2015 | Zhang et al. |
| 2016/0093670 A1 | 3/2016 | Jiang et al. |
| 2016/0141490 A1 | 5/2016 | Junk et al. |
| 2016/0217842 A1 | 7/2016 | Jeong et al. |
| 2016/0218145 A1* | 7/2016 | Han ................. H01L 27/222 |
| 2016/0276580 A1 | 9/2016 | Tahmasebi et al. |

* cited by examiner

MAGNETIC MEMORY DEVICES

CROSS-REFERENCE TO RELATED APPLICATION

This U.S. non-provisional patent application is a continuation of U.S. application Ser. No. 14/964,251, filed Dec. 9, 2015, which claims priority under 35 U.S.C. §119 to Korean Patent Application No. 10-2015-0010619, filed on Jan. 22, 2015, in the Korean Intellectual Property Office, the entire contents of which are hereby incorporated herein by reference.

BACKGROUND

The present disclosure relates to memory devices. Due to increased demand for electronic devices with fast operating speeds and/or low power consumption, it may be desirable for memory devices embedded in electronic devices to provide fast operating speeds and/or low operating voltages. Magnetic memory devices have been suggested to help address such demand because magnetic memory devices can provide technical advantages such as reduced latency and/or non-volatility. Magnetic memory devices are thus emerging as next-generation memory devices.

A magnetic memory device may be configured to include a plurality of magnetic tunnel junctions (MTJs), each of which includes two magnetic layers and a tunnel barrier layer interposed therebetween. Resistance of each MTJ may vary depending on magnetization directions of its magnetic layers. For example, the resistance of an MTJ is higher when magnetization directions of its magnetic layers are anti-parallel to each other than when the magnetization directions are parallel to each other. This difference in resistance can be used for data storing operations of the magnetic memory device.

In particular, for a spin-transfer-torque magnetic random access memory (STT-MRAM), it may be possible to reduce an amount or density of a write current required for a writing operation, even when a size of a magnetic memory cell decreases, and the STT-MRAM may thus be regarded as an option/alternative for realizing a high density memory device.

SUMMARY

Various embodiments of present inventive concepts provide magnetic memory devices with improved magnetic characteristics and higher reliability. Moreover, some embodiments provide methods of fabricating a magnetic memory device that has improved magnetic characteristics and higher reliability.

According to various embodiments of present inventive concepts, a magnetic memory device may include a lower insulating layer on a substrate. The magnetic memory device may include an insulating structure on the lower insulating layer. The magnetic memory device may include a lower contact in the lower insulating layer. The magnetic memory device may include a lower electrode in the insulating structure and electrically connected to the lower contact. Moreover, the magnetic memory device may include a magnetic tunnel junction pattern in contact with at least a portion of a top surface of the insulating structure and at least a portion of a top surface of the lower electrode. The lower electrode may include a bottom portion and a protruding portion protruding from a top surface of the bottom portion toward the magnetic tunnel junction pattern. At least a portion of the top surface of the bottom portion of the lower electrode may be in contact with the insulating structure. A root-mean-square roughness of the top surfaces of the insulating structure and the lower electrode that are in contact with the magnetic tunnel junction pattern may range from 0.01 nanometers (nm) to 1 nm.

In various embodiments, a first contact area between the magnetic tunnel junction pattern and the top surface of the insulating structure may be larger than a second contact area between the magnetic tunnel junction pattern and the top surface of the lower electrode. In some embodiments, the bottom portion of the lower electrode may be spaced apart from the magnetic tunnel junction pattern. In some embodiments, the insulating structure may have an amorphous structure. Moreover, the lower electrode may have a polycrystalline structure.

According to various embodiments, a first roughness of the top surface of the insulating structure may be less rough than a second roughness of a top surface of the protruding portion of the lower electrode. Moreover, in some embodiments, the protruding portion of the lower electrode may have a top surface coplanar with the top surface of the insulating structure.

A magnetic memory device, according to various embodiments, may include a lower insulating layer on a substrate. The magnetic memory device may include a lower contact in the lower insulating layer. The magnetic memory device may include a first insulating pattern on the lower insulating layer. The first insulating pattern may have a gap therein that overlies the lower contact. The magnetic memory device may include a lower electrode in the gap, on the lower contact and on a side surface of the first insulating pattern. The magnetic memory device may include a second insulating pattern in the gap, on the lower electrode. Moreover, the magnetic memory device may include a magnetic tunnel junction pattern in contact with at least a portion of a top surface of each of the lower electrode, the first insulating pattern, and the second insulating pattern. A root-mean-square roughness of the top surfaces of the first and second insulating patterns and the lower electrode that are in contact with the magnetic tunnel junction pattern may range from 0.01 nanometers (nm) to 1 nm.

In various embodiments, the first and second insulating patterns may define an insulating structure. Moreover, a first contact area between the magnetic tunnel junction pattern and a top surface of the insulating structure may be larger than a second contact area between the magnetic tunnel junction pattern and the top surface of the lower electrode.

According to various embodiments, at least one of the first and second insulating patterns may have an amorphous structure. Moreover, the lower electrode may have a polycrystalline structure.

In various embodiments, a roughness of the top surface of each of the first and second insulating patterns may be less rough than a roughness of the top surface of the lower electrode. In some embodiments, the top surface of the lower electrode may be coplanar with the top surfaces of the first and second insulating patterns. Moreover, in some embodiments, the lower electrode may have a closed-bottom hollow cylinder shape.

A magnetic memory device, according to various embodiments, may include first and second contacts. The magnetic memory device may include a Magnetic Tunnel Junction (MTJ) structure between the first and second contacts. The MTJ structure may include a tunnel barrier layer between first and second magnetic layers. The magnetic memory device may include an insulating structure between the MTJ structure and one of the first and second contacts. Moreover, the magnetic memory device may include an electrode between the MTJ structure and the one of the first and second contacts. A first contact area of the electrode with the MTJ structure may be smaller than a second contact area of the insulating structure with the MTJ structure.

In various embodiments, the electrode may include first and second portions that contact the MTJ structure and that are electrically connected to the one of the first and second contacts. Moreover, the insulating structure may include a portion that is between the first and second portions of the electrode. In some embodiments, the electrode may include a third portion from which the first and second portions protrude toward the MTJ structure. The third portion may have a first width that is equal to a second width of the one of the first and second contacts.

According to various embodiments, the electrode may include a first portion that contacts the MTJ structure with the first contact area. Moreover, the electrode may include a second portion that contacts the one of the first and second contacts with a third contact area that is larger than the first contact area. In some embodiments, the insulating structure may contact the MTJ structure and the one of the first and second contacts.

In various embodiments, a surface of the electrode that contacts the MTJ structure may be rougher than a surface of the insulating structure that contacts the MTJ structure. The electrode may have a polycrystalline structure, and the insulating structure may have an amorphous structure. Moreover, the MTJ structure and the electrode may be misaligned such that a portion of the electrode laterally extends beyond a side surface of the MTJ structure.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1A:
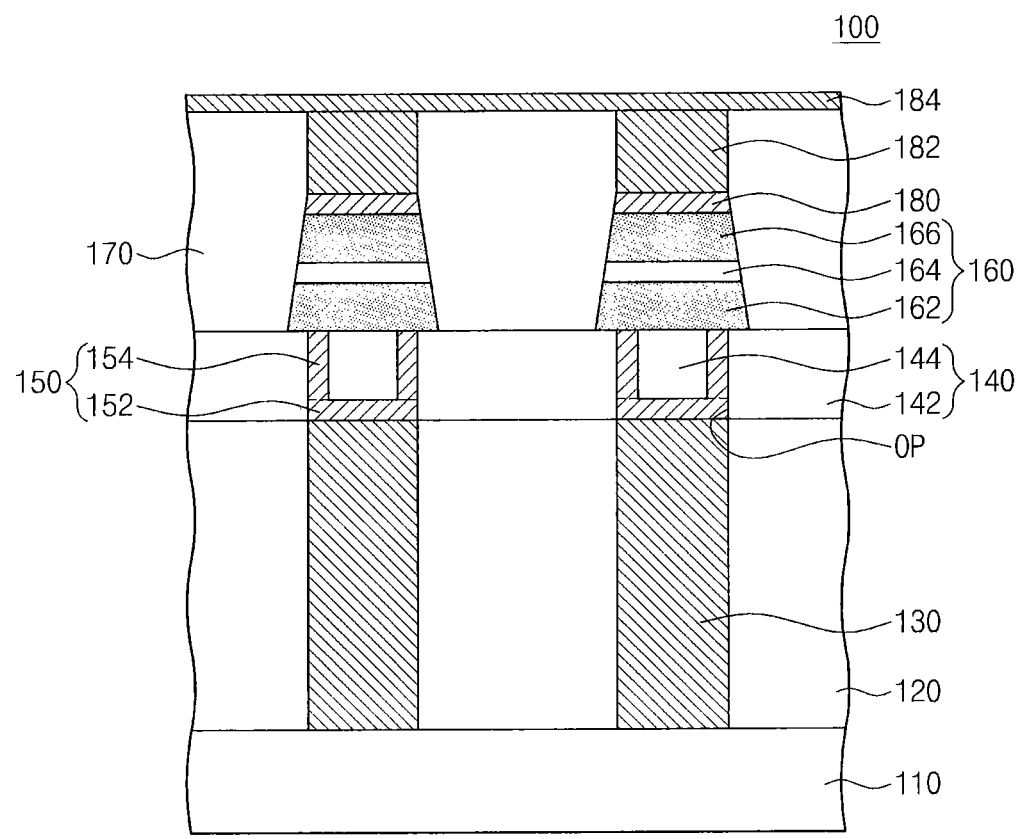
FIG. 1A is a sectional view illustrating a magnetic memory device according to some example embodiments of present inventive concepts.

It should be noted that these figures are intended to illustrate the general characteristics of methods, structure(s), and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions, and/or structural elements may be reduced or exaggerated for clarity. The use of similar or identical reference numbers in the various drawings is intended to indicate the presence of a similar or identical element or feature.

DETAILED DESCRIPTION

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout the description.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Example embodiments of present inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of present inventive concepts should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of example embodiments.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Figure 1B:
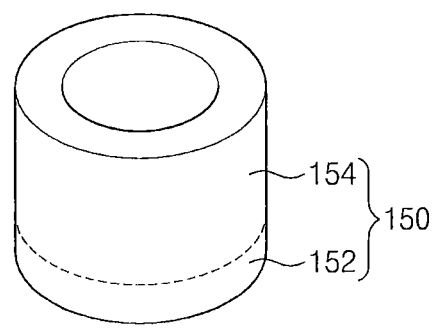
FIG. 1B is a perspective view illustrating a lower electrode of the magnetic memory device of FIG. 1A according to some embodiments.

FIG. 1A is a sectional view illustrating a magnetic memory device according to some embodiments of present inventive concepts. FIG. 1B is a perspective view illustrating a lower electrode of the magnetic memory device of FIG. 1A according to some embodiments.

Referring to FIGS. 1A and 1B, a magnetic memory device 100 may include a substrate 110, a lower insulating layer 120, a lower contact 130, an insulating structure 140, a lower electrode 150, a magnetic tunnel junction pattern 160, an upper insulating layer 170, and an upper electrode 180.

The lower insulating layer 120 may be provided on the substrate 110. The substrate 110 may include a selection element, such as a transistor or a diode. The lower insulating layer 120 may include at least one of silicon oxide, silicon nitride, or silicon oxynitride.

The lower contact 130 may be provided to vertically penetrate the lower insulating layer 120. The lower contact 130 may be electrically connected to the substrate 110. In the case where the transistor is used as the selection element, the lower contact 130 may be electrically connected to a drain region of the transistor. The lower contact 130 may include at least one of metals (e.g., tungsten, copper, or aluminum), conductive metal nitrides (e.g., titanium nitride or tantalum nitride), or transition metals (e.g., titanium or tantalum).

The insulating structure 140 may be provided on the lower insulating layer 120. The insulating structure 140 may include at least one of silicon oxide, silicon nitride, and silicon oxynitride and may have an amorphous structure. A top surface of the insulating structure 140 may have roughness smoother (e.g., less rough) than that of a top surface of a protruding portion 154 to be described below.

The lower electrode 150 may be provided to vertically penetrate the insulating structure 140. The lower electrode 150 may be electrically connected to the lower contact 130. As an example, a bottom surface of the lower electrode 150 may be in contact with a top surface of the lower contact 130, as shown in FIG. 1A. As another example, a conductive pad may be additionally provided between the lower electrode 150 and the lower contact 130, and in this case, the lower electrode 150 and the lower contact 130 may be electrically connected to each other through the conductive pad. The lower electrode 150 may include a bottom portion 152 and a protruding portion 154. The bottom portion 152 may be a plate-shaped portion positioned at the lowermost level of the lower electrode 150, and the protruding portion 154 may be a portion protruding from a top surface of the bottom portion 152 in a direction away from the substrate 110 (i.e., toward the magnetic tunnel junction pattern 160 to be described in more detail below). A top surface of the protruding portion 154 may be coplanar with that of the insulating structure 140. The top surface of the protruding portion 154 may have an area smaller than that of the top surface of the bottom portion 152. In example embodiments, a bottom surface of the protruding portion 154 may have an area smaller than that of the top surface of the bottom portion 152. The lower electrode 150 may include at least one of metals (e.g., tungsten, copper, or aluminum), conductive metal nitrides (e.g., titanium nitride or tantalum nitride), or transition metals (e.g., titanium or tantalum) and may have a polycrystalline structure.

In example embodiments, as shown in FIGS. 1A and 1B, the lower electrode 150 may be shaped like a closed-bottom hollow cylinder. In this case, the insulating structure 140 may include a first insulating pattern 142 and a second insulating pattern 144. The first insulating pattern 142 may be provided on the lower insulating layer 120 and may have an opening OP exposing the lower contact 130. The lower electrode 150 may be provided to conformally cover side and bottom surfaces of the opening OP. A portion of the lower electrode 150 covering the bottom surface of the opening OP may correspond to the bottom portion 152, and another portion covering the sidewall(s) of the opening OP may correspond to the protruding portion 154. The second insulating pattern 144 may fill a gap delimited/defined by the bottom and protruding portions 152 and 154 of the closed-bottom hollow cylinder. The lower electrode 150 may not extend onto the top surfaces of the first and second insulating patterns 142 and 144. Further, the uppermost surface of the lower electrode 150 (i.e., the top surface of the protruding portion 154) may be coplanar with the top surfaces of the first and second insulating patterns 142 and 144. At least one of the first and second insulating patterns 142 and 144 may have an amorphous structure.

The magnetic tunnel junction pattern 160 may be provided on the lower electrode 150. The magnetic tunnel junction pattern 160 may be in contact with the top surfaces of both of the insulating structure 140 and the protruding portion 154 of the lower electrode 150, but may be spaced apart from the bottom portion 152 of the lower electrode 150. A contact area between the magnetic tunnel junction pattern 160 and the insulating structure 140 may be larger than a contact area between the magnetic tunnel junction pattern 160 and the protruding portion 154.

A root-mean-square roughness of the top surfaces of the insulating structure 140 and the lower electrode 150 in contact with the magnetic tunnel junction pattern 160 may range from about 0.01 nanometers (nm) to about 1 nm. The present inventive entity appreciates that these values of root-mean-square roughness may represent a combined roughness of the respective top surfaces of the insulating structure 140 and the lower electrode 150. In other words, the roughness of the top surface of the insulating structure 140 may be combined with the roughness of the top surface of the lower electrode 150, and the combined roughness may be represented as a value of root-mean-square roughness that ranges from about 0.01 nm to about 1 nm.

The magnetic tunnel junction (MTJ) pattern (e.g., MTJ structure) 160 may include a first magnetic pattern 162, a tunnel barrier (e.g., tunnel insulating) pattern 164, and a second magnetic pattern 166, which are sequentially stacked on the substrate 110. Each of the first magnetic pattern 162, the tunnel barrier pattern 164, and the second magnetic pattern 166 may have its own crystal structure. Materials and data storing mechanism(s) of the magnetic tunnel junction pattern 160 will be described in detail with reference to FIGS. 20 and 21.

In some example embodiments, the magnetic tunnel junction pattern 160 may further include an additional lower electrode positioned at a bottom thereof. The additional lower electrode may include at least one of metals (e.g., tungsten, copper, or aluminum), conductive metal nitrides (e.g., titanium nitride or tantalum nitride), or transition metals (e.g., titanium or tantalum). Alternatively, the additional lower electrode may not be provided in (e.g., may be omitted from) the magnetic tunnel junction pattern 160.

The upper electrode 180, an upper contact 182, and a bit line 184 may be sequentially provided on the magnetic tunnel junction pattern 160. The upper electrode 180, the upper contact 182, and the bit line 184 may include at least one of metals (e.g., tungsten, copper, or aluminum), conductive metal nitrides (e.g., titanium nitride or tantalum nitride), or transition metals (e.g., titanium or tantalum).

The upper insulating layer 170 may be provided between the insulating structure 140 and the bit line 184 to cover side surfaces of the magnetic tunnel junction pattern 160, the upper electrode 180, and the upper contact 182. The upper insulating layer 170 may include at least one of silicon oxide, silicon nitride, or silicon oxynitride.

In general, a crystal structure of the magnetic tunnel junction pattern 160 may be affected by a roughness and a crystal structure of underlying structures in contact with the magnetic tunnel junction pattern 160. In other words, in the case where a contact area between the magnetic tunnel junction pattern 160 and an underlying structure with high roughness or of crystalline structure is increased, a crystal structure of the magnetic tunnel junction pattern 160 may deteriorate.

By contrast, in the case of the magnetic memory device 100 described herein, the magnetic tunnel junction pattern 160 may have a larger contact area with the top surface of the insulating structure 140 than with that of the lower electrode 150. The roughness of the top surface of the insulating structure 140 may be smoother (e.g., less rough) than that of the top surface of the lower electrode 150. By virtue of the larger contact area with the insulating structure 140 with the lower/lesser roughness, it may be possible to improve the crystal structure of the magnetic tunnel junction pattern 160. Further, the insulating structure 140 may have an amorphous structure, whereas the lower electrode 150 may have a poly-crystalline structure. By virtue of the larger contact area with the insulating structure 140 of the amorphous structure, it may be possible to further improve the crystal structure of the magnetic tunnel junction pattern 160.

In addition, for the magnetic memory device 100, it may be possible to reduce a contact area between the magnetic tunnel junction pattern 160 and the lower electrode 150, compared with a conventional MTJ structure, and this may make it possible to increase a contact resistance between the magnetic tunnel junction pattern 160 and the lower electrode 150. Accordingly, a large quantity of Joule heating may be generated near the magnetic tunnel junction pattern 160, and such Joule heating may allow the magnetic tunnel junction pattern 160 to execute its writing operation with efficiency. For example, the reduction in contact area between the magnetic tunnel junction pattern 160 and the lower electrode 150 may make it possible to locally increase a temperature of the magnetic tunnel junction pattern 160 and thereby to switch the magnetization direction of the free layer with relative ease.

Figure 2A:
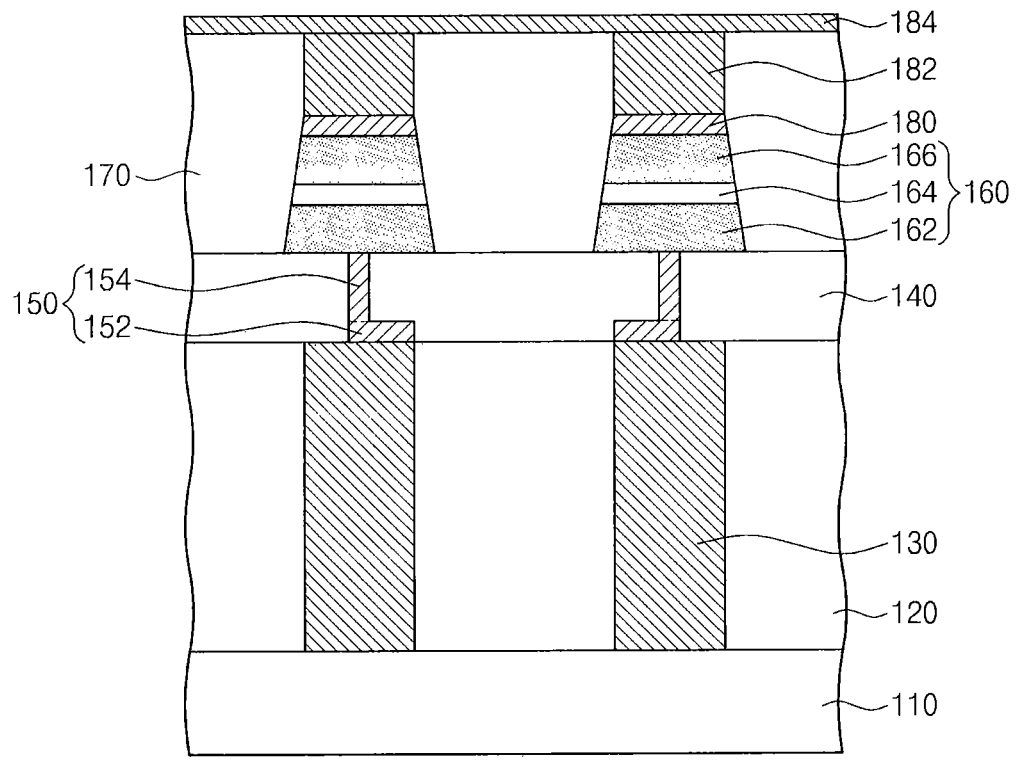
FIG. 2A is a sectional view illustrating a magnetic memory device according to some embodiments of present inventive concepts.
Figure 2B:
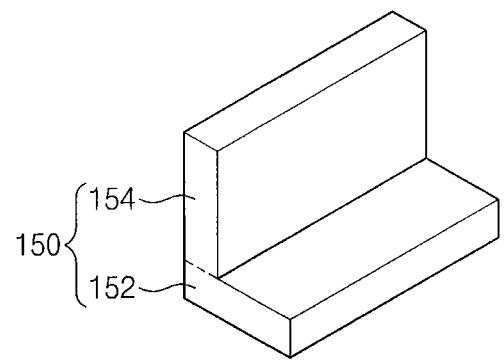
FIG. 2B is a perspective view illustrating a lower electrode of the magnetic memory device of FIG. 2A according to some embodiments.

FIG. 2A is a sectional view illustrating a magnetic memory device according to some embodiments of present inventive concepts. FIG. 2B is a perspective view illustrating a lower electrode of the magnetic memory device of FIG. 2A according to some embodiments.

Referring to FIGS. 2A and 2B, a magnetic memory device 101 may include a substrate 110, a lower insulating layer 120, a lower contact 130, an insulating structure 140, a lower electrode 150, a magnetic tunnel junction pattern 160, an upper insulating layer 170, and an upper electrode 180.

The substrate 110, the lower insulating layer 120, and the lower contact 130 may be configured to have substantially the same features as those of the magnetic memory device 100 described with reference to FIG. 1A. For concise description, such a previously described element may be identified by a similar or identical reference number without repeating/duplicating descriptions thereof.

The insulating structure 140 may be provided on the lower insulating layer 120. The insulating structure 140 may include at least one of silicon oxide, silicon nitride, or silicon oxynitride and may have an amorphous structure. A top surface of the insulating structure 140 may have roughness smoother (e.g., less rough) than that of a top surface of a protruding portion 154 to be described below.

The lower electrode 150 may be provided to vertically penetrate the insulating structure 140. The lower electrode 150 may be electrically connected to the lower contact 130. As an example, a bottom surface of the lower electrode 150 may be in contact with a top surface of the lower contact 130, as shown in FIG. 2A. As another example, a conductive pad may be additionally provided between the lower electrode 150 and the lower contact 130, and in this case, the lower electrode 150 and the lower contact 130 may be electrically connected to each other through the conductive pad. The lower electrode 150 may include a bottom portion 152 and a protruding portion 154. The bottom portion 152 may be a plate-shaped portion positioned at the lowermost level of the lower electrode 150, and the protruding portion 154 may be a portion protruding from a top surface of the bottom portion 152 in a direction away from the substrate 110 (i.e., toward the magnetic tunnel junction pattern 160 to be described in more detail below). A top surface of the protruding portion 154 may be coplanar with that of the insulating structure 140. The top surface of the protruding portion 154 may have an area smaller than that of the top surface of the bottom portion 152. In example embodiments, a bottom surface of the protruding portion 154 may have an area smaller than that of the top surface of the bottom portion 152. The lower electrode 150 may include at least one of metals (e.g., tungsten, copper, or aluminum), conductive metal nitrides (e.g., titanium nitride or tantalum nitride), or transition metals (e.g., titanium or tantalum), and may have a polycrystalline structure.

In example embodiments, as shown in FIGS. 2A and 2B, the lower electrode 150 may have an "L"-shaped vertical section. In this case, a horizontal portion of the lower electrode 150 may correspond to the bottom portion 152, and a vertical portion of the lower electrode 150 may correspond to the protruding portion 154. The insulating structure 140 may cover a sidewall of the lower electrode 150 and expose the uppermost surface of the lower electrode 150 (e.g., the top surface of the protruding portion 154). The uppermost surface of the lower electrode 150 may be coplanar with the top surface of the insulating structure 140.

The magnetic tunnel junction pattern 160, the upper insulating layer 170, the upper electrode 180, the upper contact 182, and the bit line 184 may be configured to have substantially the same features as those of the magnetic memory device 100 described with reference to FIG. 1A. For concise description, such a previously described element may be identified by a similar or identical reference number without repeating/duplicating descriptions thereof.

In the case of the magnetic memory device 101, the magnetic tunnel junction pattern 160 may be formed to have a larger contact area with the top surface of the insulating structure 140 than with that of the lower electrode 150. Here, the roughness of the top surface of the insulating structure 140 may be smoother (e.g., less rough) than that of the top surface of the lower electrode 150. This may make it possible to improve the crystal structure of the magnetic tunnel junction pattern 160. Further, the insulating structure 140 may have an amorphous structure, whereas the lower electrode 150 may have a poly-crystalline structure. This may make it possible to further improve the crystal structure of the magnetic tunnel junction pattern 160.

In addition, for the magnetic memory device 101, it may be possible to reduce a contact area between the magnetic tunnel junction pattern 160 and the lower electrode 150, compared with a conventional MTJ structure, and this may make it possible to increase a contact resistance between the magnetic tunnel junction pattern 160 and the lower electrode 150. Accordingly, a large quantity of Joule heating may be generated near the magnetic tunnel junction pattern 160, and such Joule heating may allow the magnetic tunnel junction pattern 160 to execute its writing operation with efficiency. For example, the reduction in contact area between the magnetic tunnel junction pattern 160 and the lower electrode 150 may make it possible to locally increase a temperature of the magnetic tunnel junction pattern 160 and thereby to switch the magnetization direction of the free layer with ease.

FIGS. 3A, 4A, 5A, 6A, 7A, and 8A are plan views illustrating a method of fabricating a magnetic memory device according to some embodiments of present inventive concepts. FIGS. 3B, 4B, 5B, 6B, 7B, and 8B are sectional views taken along line I-I' of FIGS. 3A, 4A, 5A, 6A, 7A, and 8A, respectively. For concise description, a previously described element may be identified by a similar or identical reference number without repeating/duplicating descriptions thereof.

Figure 3A:
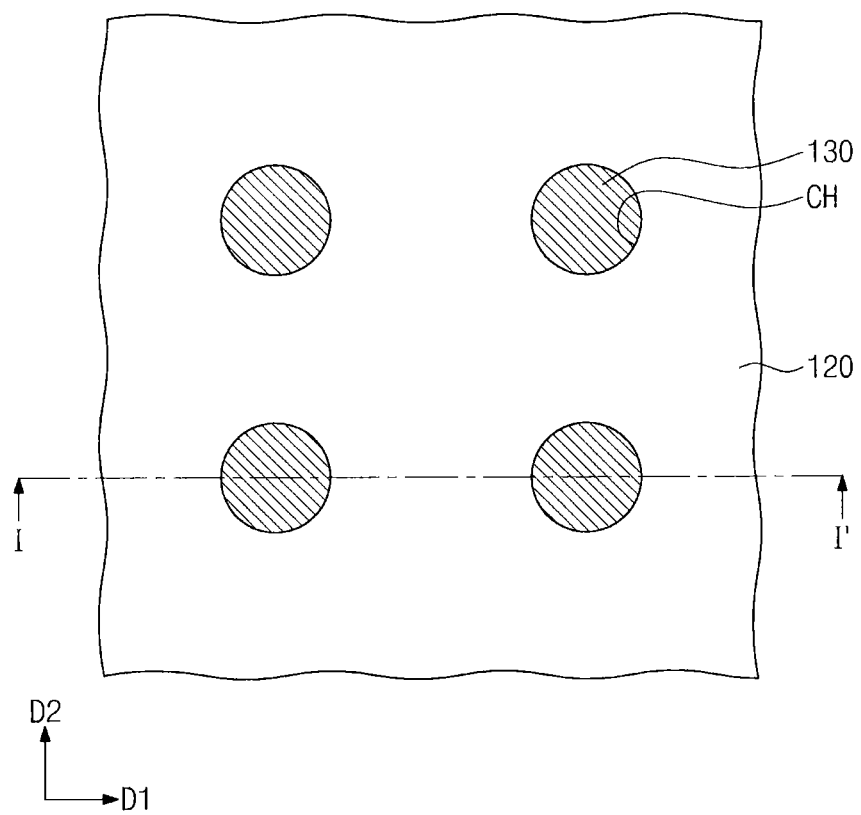
FIGS. 3A, 4A, 5A, 6A, 7A, and 8A are plan views illustrating a method of fabricating a magnetic memory device (e.g., the magnetic memory device of FIG. 1A) according to some embodiments of present inventive concepts.
Figure 3B:
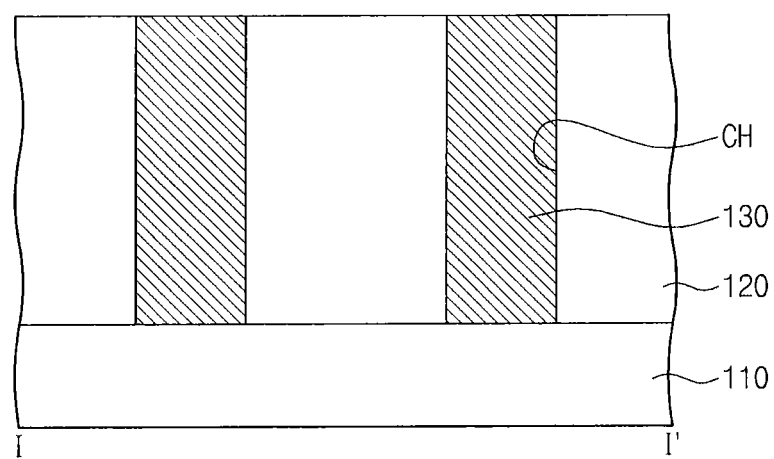
FIGS. 3B, 4B, 5B, 6B, 7B, and 8B are sectional views taken along line I-I' of FIGS. 3A, 4A, 5A, 6A, 7A, and 8A, respectively.

Referring to FIGS. 3A and 3B, the first lower insulating layer 120 and the lower contact 130 may be formed on the substrate 110. The lower contact 130 may penetrate the first lower insulating layer 120. The formation of the lower contact 130 may include forming a contact hole CH which penetrates the first lower insulating layer 120, forming a preliminary lower contact layer to fill the contact hole CH, and planarizing the preliminary lower contact layer to expose a top surface of the first lower insulating layer 120. As an example, as shown in FIG. 3B, the top surface of the substrate 110 may be exposed through the contact hole CH, but example embodiments of present inventive concepts may not be limited thereto.

Figure 4A:
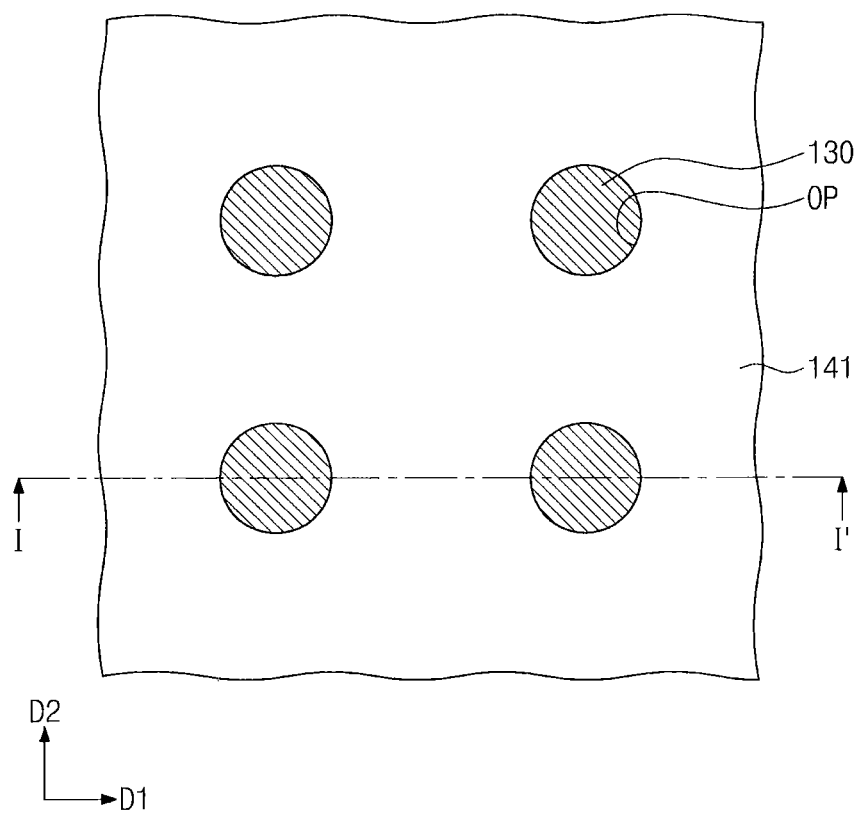
Figure 4B:
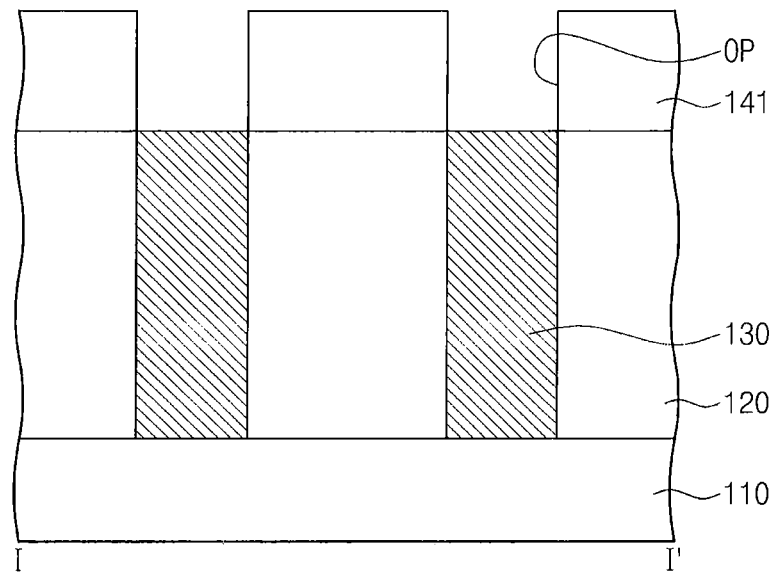

Referring to FIGS. 4A and 4B, a second lower insulating layer 141 may be formed on the first lower insulating layer 120 to have the opening OP. The opening OP may be formed to expose the top surface of the lower contact 130. The second lower insulating layer 141 may be formed of or include at least one of silicon oxide, silicon nitride, or silicon oxynitride and may have an amorphous structure.

Figure 5A:
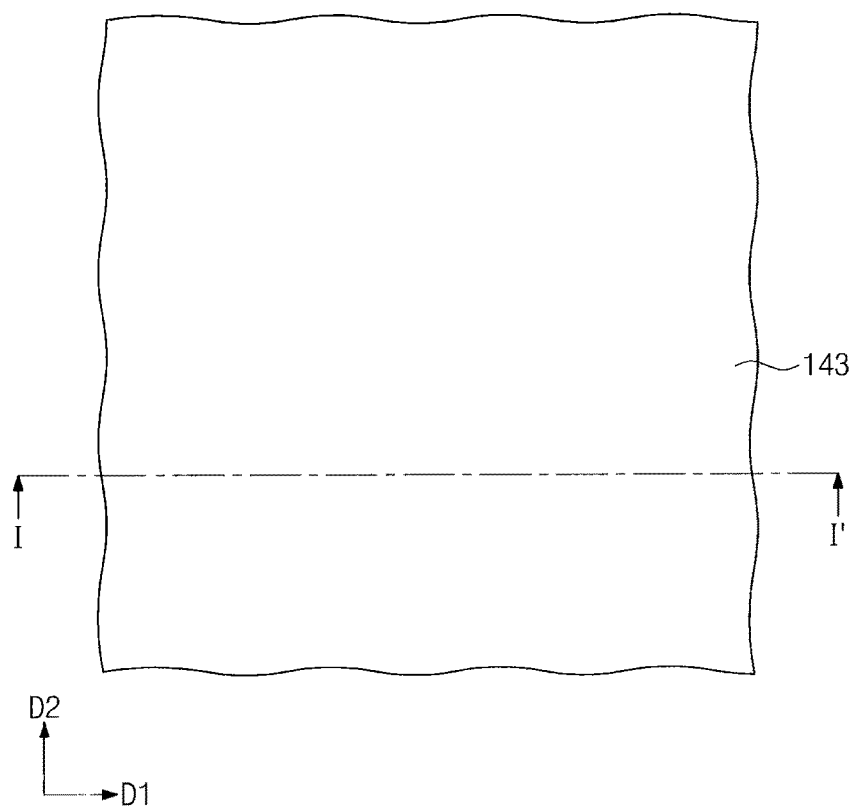
Figure 5B:
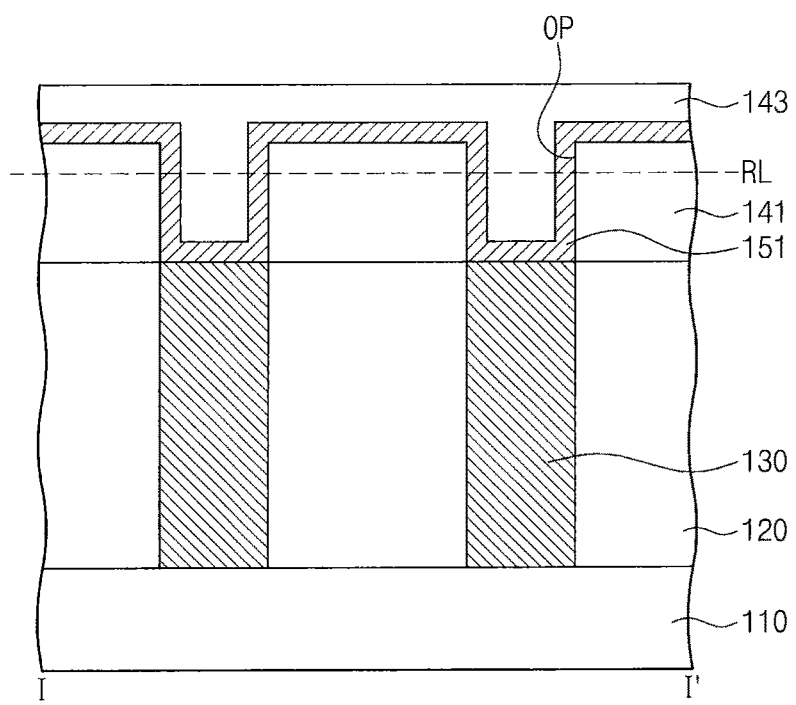

Referring to FIGS. 5A and 5B, a conductive layer 151 and a third lower insulating layer 143 may be formed.

The conductive layer 151 may be formed to conformally cover bottom and side surfaces of the opening OP. The conductive layer 151 may extend to cover the top surface of the second lower insulating layer 141. The conductive layer 151 may include at least one of metals (e.g., tungsten, copper, or aluminum), conductive metal nitrides (e.g., titanium nitride or tantalum nitride), or transition metals (e.g., titanium or tantalum) and may have a polycrystalline structure.

The third lower insulating layer 143 may be formed on the conductive layer 151 to fill the opening OP. The third lower insulating layer 143 may include at least one of silicon oxide, silicon nitride, or silicon oxynitride and may have an amorphous structure. The third lower insulating layer 143 may be formed by an atomic layer deposition (ALD) process.

Figure 6A:
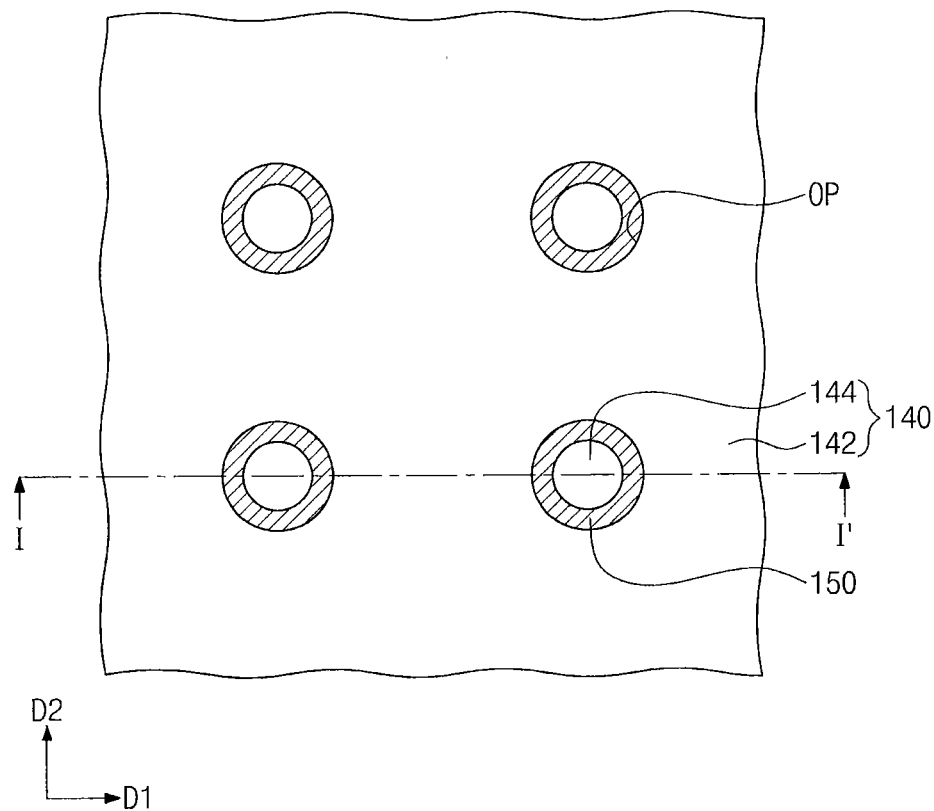
Figure 6B:
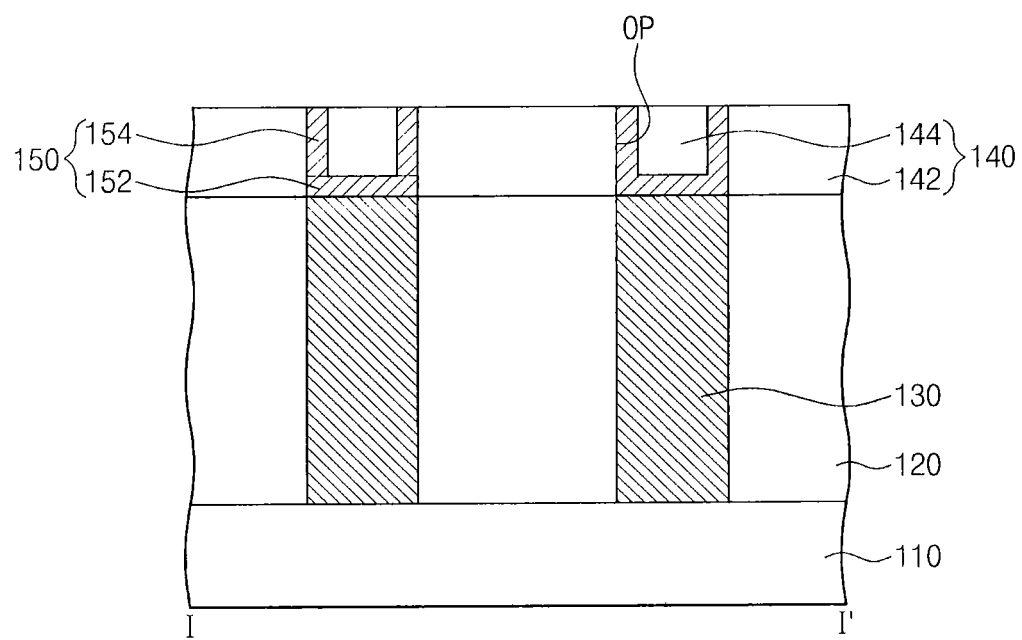

Referring to FIGS. 6A and 6B, a planarization process may be performed until the side surface of the opening OP is exposed. As an example, the planarization process may be performed to a reference level RL shown in FIG. 5B. By performing the planarization process, the lower electrode 150, the first insulating pattern 142, and the second insulating pattern 144 may be formed. The first insulating pattern 142 and the second insulating pattern 144 may constitute the insulating structure 140. In example embodiments, the planarization process may be performed using a chemical mechanical polishing (CMP) process. The lower electrode 150, the first insulating pattern 142, and the second insulating pattern 144 may be formed to have top surfaces coplanar with each other. The top surface of the first or second insulating pattern 142 or 144 may have a lesser (e.g., smoother) roughness than that of the lower electrode 150.

The lower electrode 150 may be formed from the conductive layer 151. A portion of the conductive layer 151 positioned on the second lower insulating layer 141 may be removed by the planarization process. Accordingly, the lower electrode 150 may include the bottom and protruding portions 152 and 154 covering the bottom and side surfaces, respectively, of the opening OP. As an example, the lower electrode 150 may be formed to have a closed-bottom hollow cylinder shape.

The first insulating pattern 142 may be formed from the second lower insulating layer 141. Accordingly, the first insulating pattern 142 may also have the opening OP, in which the lower electrode 150 is provided.

The second insulating pattern 144 may be formed from the third lower insulating layer 143. The second insulating pattern 144 may be locally formed in the opening OP. As an example, in the case where the lower electrode 150 is shaped like a closed-bottom hollow cylinder, the second insulating pattern 144 may be formed to fill a gap region defined by the lower electrode 150.

Figure 7A:
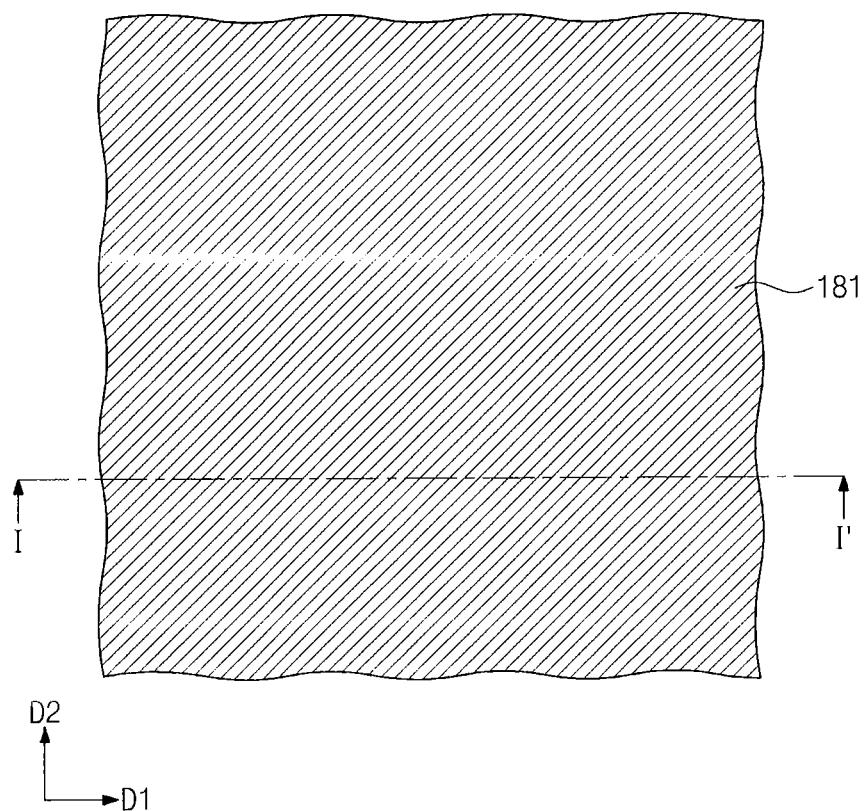
Figure 7B:
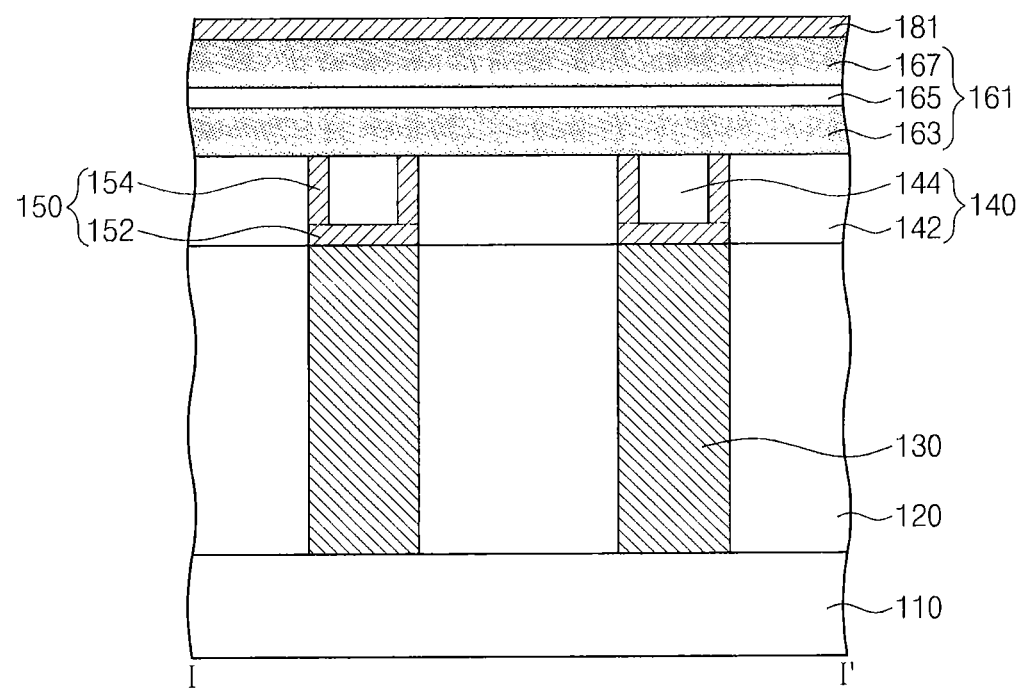

Referring to FIGS. 7A and 7B, a MTJ-layer stack 161 and a conductive layer 181 may be sequentially formed on the insulating structure 140. The formation of the MTJ-layer stack 161 may include sequentially forming a first magnetic layer 163, a tunnel barrier layer 165, and a second magnetic layer 167 on the insulating structure 140. The conductive layer 181 may include at least one of metals (e.g., tungsten, copper, or aluminum), conductive metal nitrides (e.g., titanium nitride or tantalum nitride), or transition metals (e.g., titanium or tantalum). In some embodiments, an additional conductive layer may be formed before the formation of the MTJ-layer stack 161. The additional conductive layer may include at least one of metals (e.g., tungsten, copper, or aluminum), conductive metal nitrides (e.g., titanium nitride or tantalum nitride), or transition metals (e.g., titanium or tantalum). Alternatively, the formation of the additional conductive layer may be omitted.

Figure 8A:
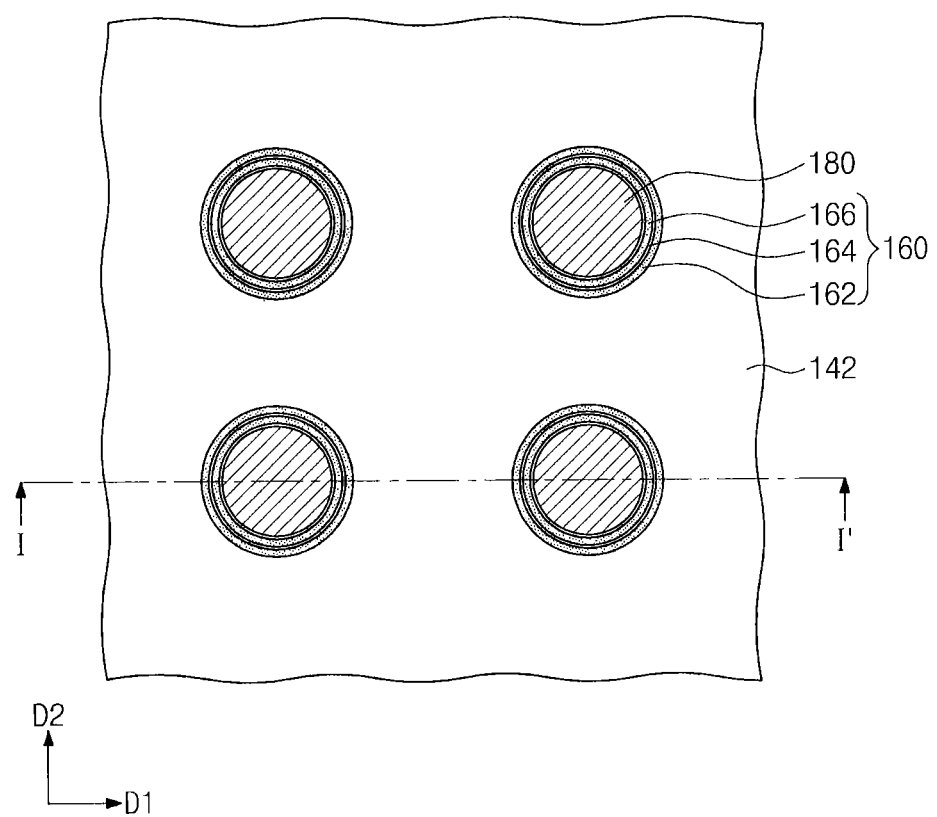
Figure 8B:
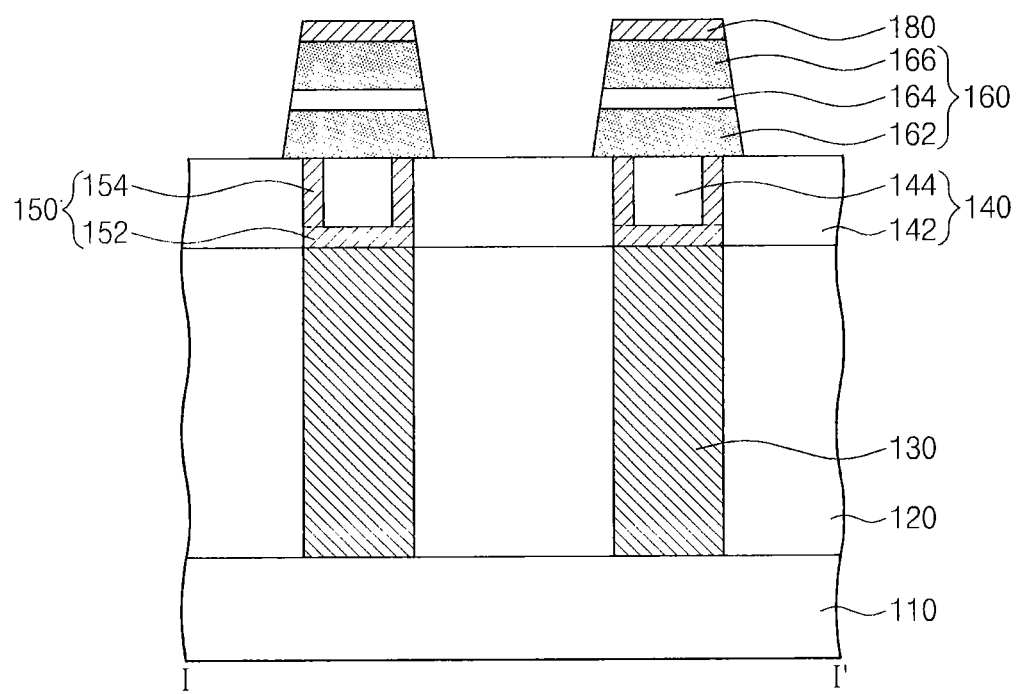

Referring to FIGS. 8A and 8B, the MTJ-layer stack 161 and the conductive layer 181 may be patterned to form the magnetic tunnel junction pattern 160 and the upper electrode 180. As an example, the formation of the magnetic tunnel junction pattern 160 may include patterning the MTJ-layer stack 161 using the upper electrode 180 as an etch mask. In the case where an additional conductive layer is formed, the additional conductive layer may be patterned along with the MTJ-layer stack 161, when the MTJ-layer stack 161 is patterned. In this case, an additional lower electrode may be formed.

The magnetic tunnel junction pattern 160 may be in contact with not only at least a portion of the second insulating pattern 144 but also at least a portion of the lower electrode 150. In some embodiments, the magnetic tunnel junction pattern 160 may also be in contact with a portion of the first insulating pattern 142 adjacent to the lower electrode 150. A contact area between the magnetic tunnel junction pattern 160 and the top surface of the insulating structure 140 may be greater than that between the magnetic tunnel junction pattern 160 and the top surface of the protruding portion 154.

A root-mean-square roughness of the top surfaces of the insulating structure 140 and the lower electrode 150 in contact with the magnetic tunnel junction pattern 160 may range from about 0.01 nm to about 1 nm. The magnetic tunnel junction pattern 160 may include the first magnetic pattern 162, the tunnel barrier pattern 164, and the second magnetic pattern 166, which are sequentially stacked on the lower electrode 150. Each of the first magnetic pattern 162, the tunnel barrier pattern 164, and the second magnetic pattern 166 may have its own crystal structure. The crystal structure of the magnetic tunnel junction pattern 160 may be affected by a contacting layer in contact with the magnetic tunnel junction pattern 160. For example, the crystal structure of the magnetic tunnel junction pattern 160 may be improved, when the contacting layer has a smaller/smoother/lesser roughness. As another example, the magnetic tunnel junction pattern 160 may have a more desirable crystal structure when the contacting layer has an amorphous structure than when the contacting layer has a crystalline structure. Materials and data storing mechanism(s) of the magnetic tunnel junction pattern 160 will be described in detail with reference to FIGS. 20 and 21.

According to method(s) of fabricating the magnetic memory device 100 illustrated in FIGS. 3A-8B, the magnetic tunnel junction pattern 160 may be formed to have a larger contact area with the top surface of the insulating structure 140 than with that of the lower electrode 150. Here, the roughness of the top surface of the insulating structure 140 may be smaller/smoother/lesser than that of the top surface of the lower electrode 150. This may make it possible to improve the crystal structure of the magnetic tunnel junction pattern 160. Further, the insulating structure 140 may have an amorphous structure, whereas the lower electrode 150 may have a poly-crystalline structure. This may make it possible to further improve the crystal structure of the magnetic tunnel junction pattern 160.

In some cases, there may be misalignment between the magnetic tunnel junction pattern 160 and the lower electrode 150, and in such cases, the lower electrode 150 may be partially exposed. According to example embodiments of present inventive concepts, an exposed top surface of the lower electrode 150 may have a small area, even when there is the misalignment between the magnetic tunnel junction pattern 160 and the lower electrode 150. This may make it possible to reduce re-deposition of the lower electrode 150 and consequently to suppress an electrical short circuit from being formed between the magnetic patterns 162 and 166 of the magnetic tunnel junction pattern 160.

Referring back to FIGS. 1A and 1B, the upper insulating layer 170, the upper contact 182, and the bit line 184 may be formed.

The upper insulating layer 170 may be formed to cover the insulating structure 140 provided with the magnetic tunnel junction pattern 160. The upper insulating layer 170 may include at least one of silicon oxide, silicon nitride, or silicon oxynitride.

The upper contact 182 may be formed to penetrate the upper insulating layer 170 and may be electrically connected to the upper electrode 180. The bit line 184 may be formed on the upper insulating layer 170 and may be electrically connected to the upper contact 182. The upper contact 182 and the bit line 184 may include at least one of metals (e.g., tungsten, copper, or aluminum), conductive metal nitrides (e.g., titanium nitride or tantalum nitride), or transition metals (e.g., titanium or tantalum).

FIGS. 9A, 10A, 11A, 12A, 13A, 14A, 15A, 16A, 17A, 18A, and 19A are plan views illustrating a method of fabricating a magnetic memory device according to some embodiments of present inventive concepts. FIGS. 9B, 10B, 11B, 12B, 13B, 14B, 15B, 16B, 17B, 18B, and 19B are sectional views taken along line II-II' of FIGS. 9A, 10A, 11A, 12A, 13A, 14A, 15A, 16A, 17A, 18A, and 19A, respectively. For concise description, a previously described element may be identified by a similar or identical reference number without repeating/duplicating descriptions thereof.

Figure 9A:
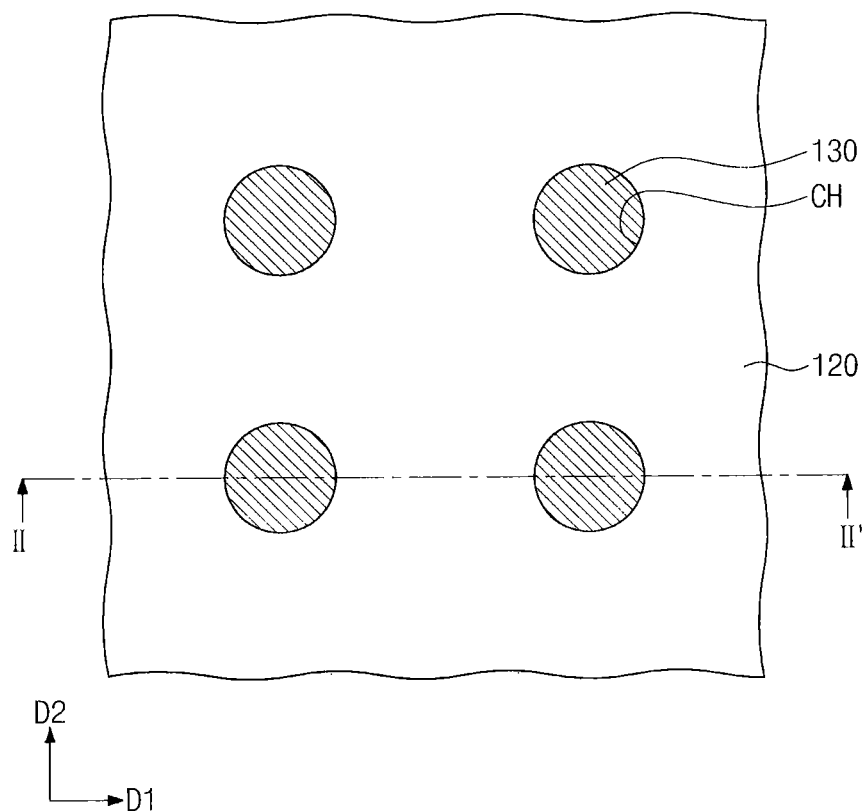
FIGS. 9A, 10A, 11A, 12A, 13A, 14A, 15A, 16A, 17A, 18A, and 19A are plan views illustrating a method of fabricating a magnetic memory device (e.g., the magnetic memory device of FIG. 2A) according to some embodiments of present inventive concepts.
Figure 9B:
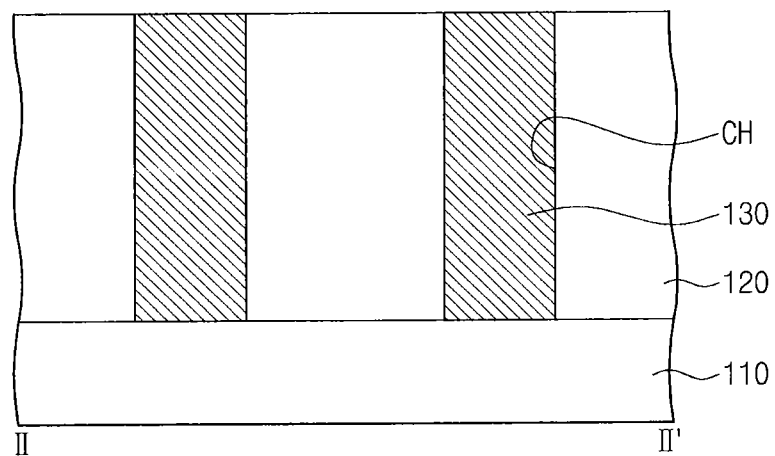
FIGS. 9B, 10B, 11B, 12B, 13B, 14B, 15B, 16B, 17B, 18B, and 19B are sectional views taken along line II-II' of FIGS. 9A, 10A, 11A, 12A, 13A, 14A, 15A, 16A, 17A, 18A, and 19A, respectively.

Referring to FIGS. 9A and 9B, the first lower insulating layer 120 and a pair of the lower contacts 130 may be formed on the substrate 110. The pair of the lower contacts may penetrate the first lower insulating layer 120. The pair of the lower contacts 130 may be disposed spaced apart from each other in a first direction D1. The formation of the lower contacts 130 may include forming the first lower insulating layer 120 on the substrate 110 to have contact holes CH, forming preliminary lower contacts to fill the contact holes CH, and planarizing the preliminary lower contacts to expose a top surface of the first lower insulating layer 120. As an example, as shown in FIG. 9B, the top surface of the substrate 110 may be exposed through the contact holes CH, but example embodiments of present inventive concepts may not be limited thereto.

Figure 10A:
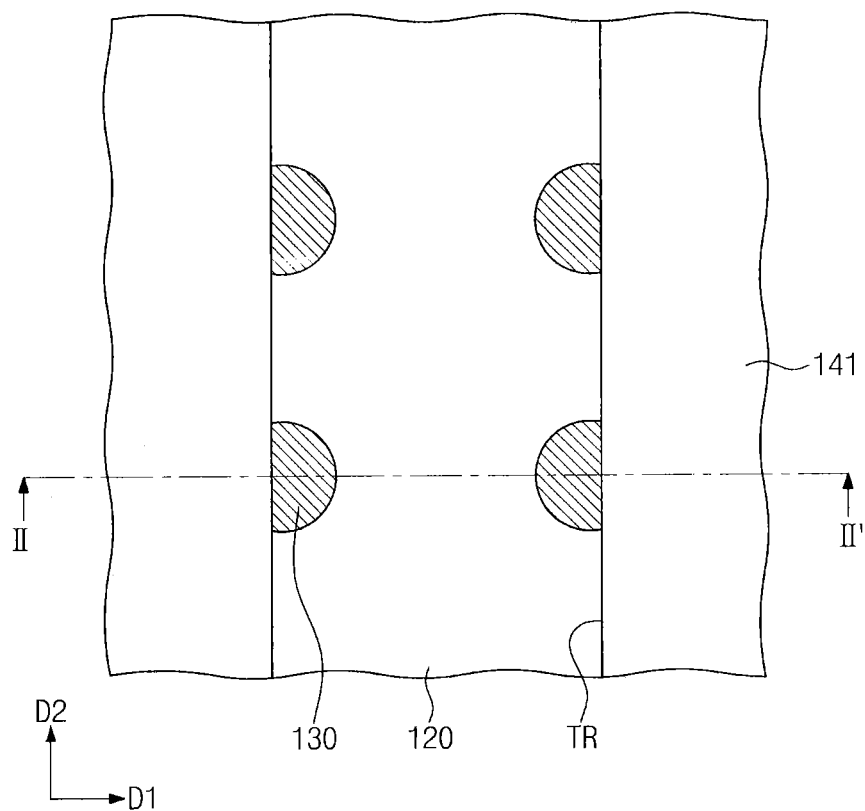
Figure 10B:
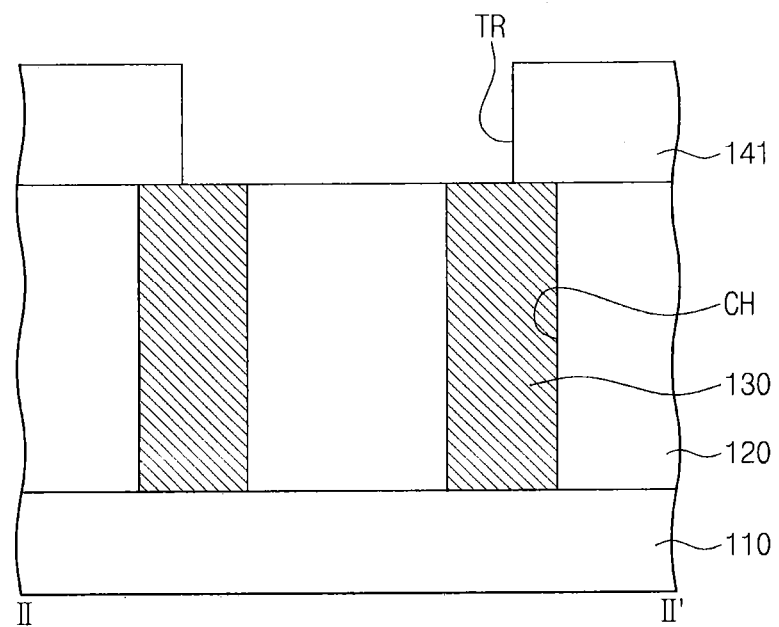

Referring to FIGS. 10A and 10B, the second lower insulating layer 141 may be formed on the first lower insulating layer 120 to have a trench TR. The trench TR may be formed to partially expose a top surface of each of the lower contacts 130. The trench TR may extend in a second direction D2 crossing the first direction D1. The second lower insulating layer 141 may include at least one of silicon oxide, silicon nitride, or silicon oxynitride and may have an amorphous structure.

Figure 11A:
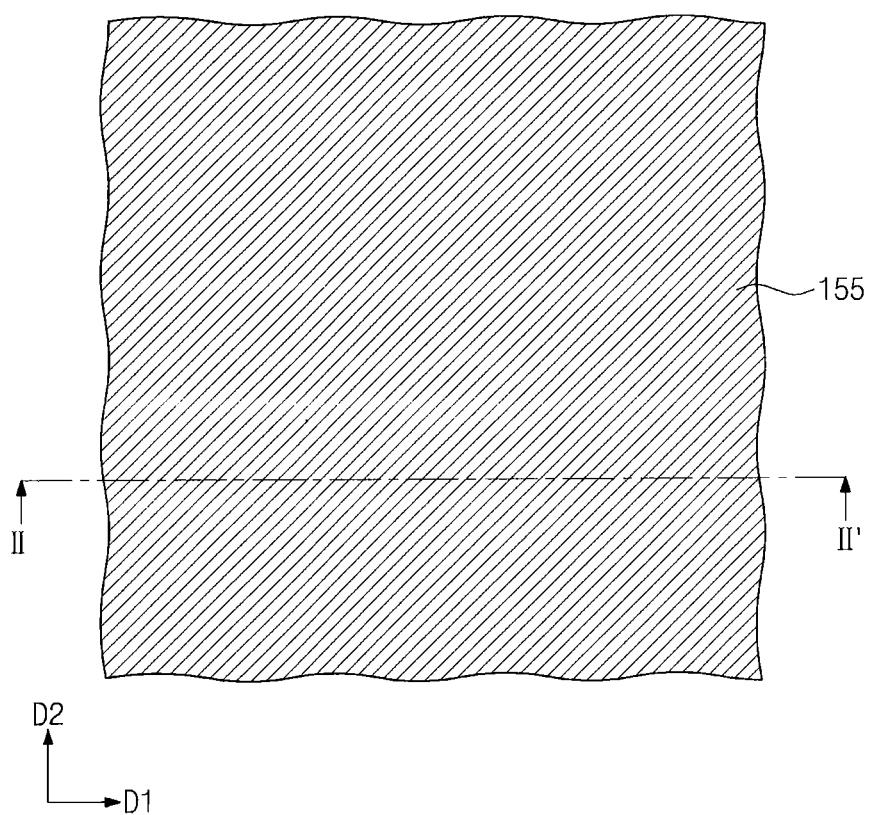
Figure 11B:
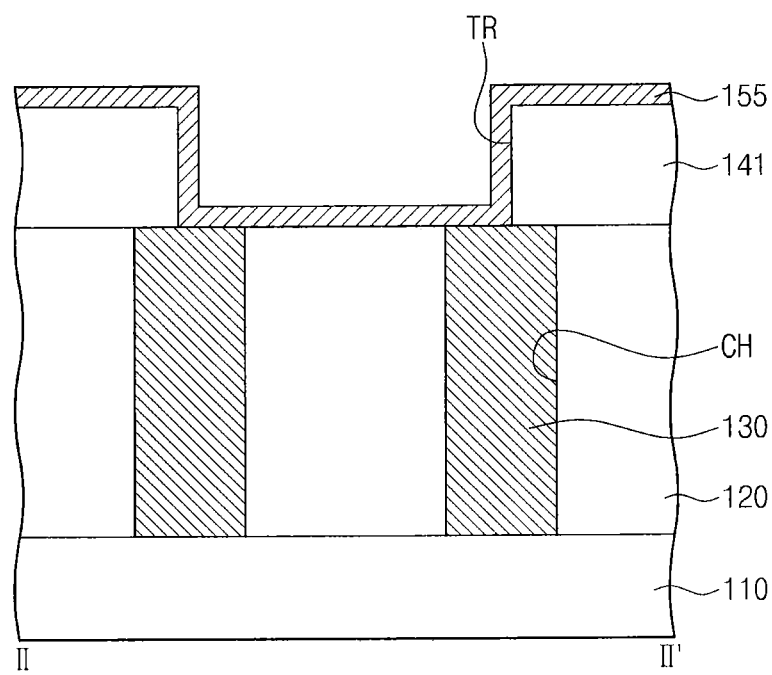

Referring to FIGS. 11A and 11B, a conductive layer 155 may be formed to conformally cover bottom and side surfaces of the trench TR. The conductive layer 155 may extend to cover the top surface of the second lower insulating layer 141. The conductive layer 155 may be in contact with the top surfaces of the lower contacts 130 exposed by the trench TR. The conductive layer 155 may include at least one of metals (e.g., tungsten, copper, or aluminum), conductive metal nitrides (e.g., titanium nitride or tantalum nitride), or transition metals (e.g., titanium or tantalum), and may have a polycrystalline structure.

Figure 12A:
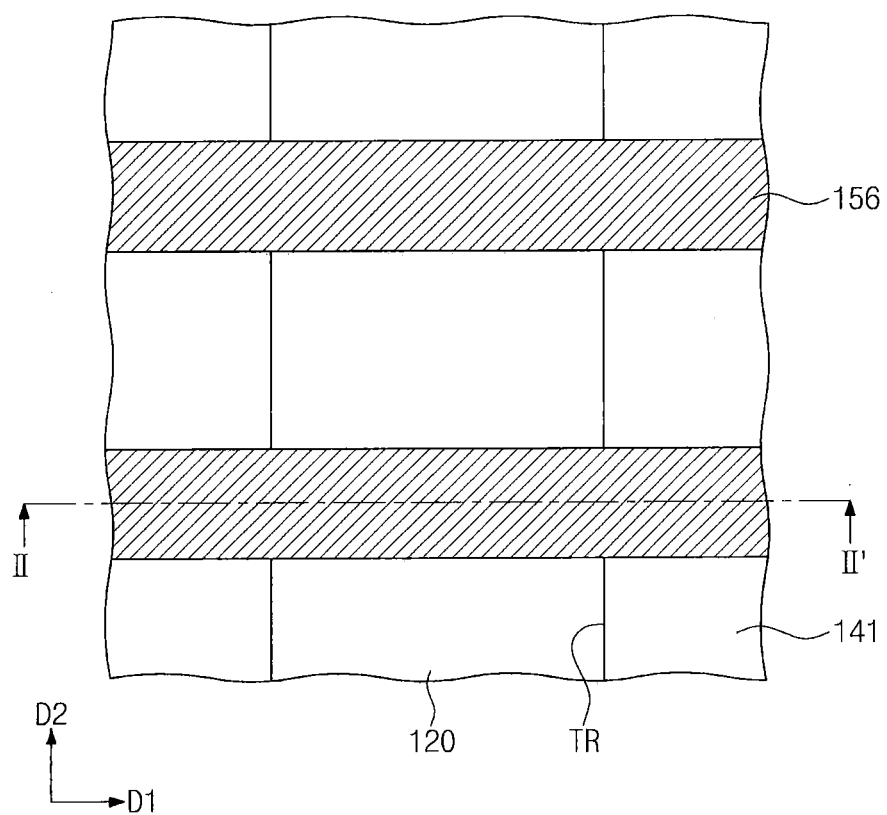
Figure 12B:
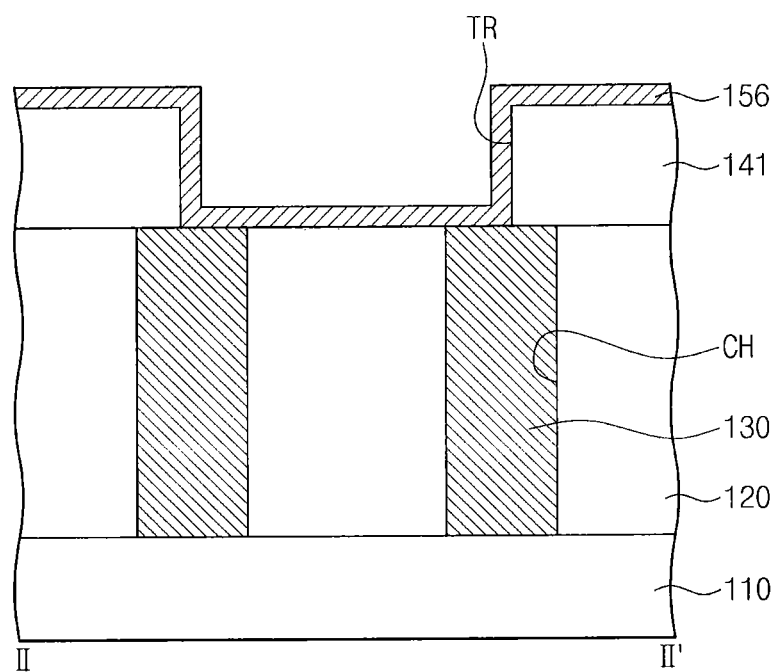

Referring to FIGS. 12A and 12B, the conductive layer 155 may be patterned to form a conductive pattern 156 extending in the first direction D1. The conductive pattern 156 may be in contact with the top surfaces of the pair of the lower contacts 130 exposed by the trench TR. In other words, the conductive pattern 156 may extend parallel to the first direction D1 and may overlap the pair of the lower contacts 130, when viewed in a plan view.

Figure 13A:
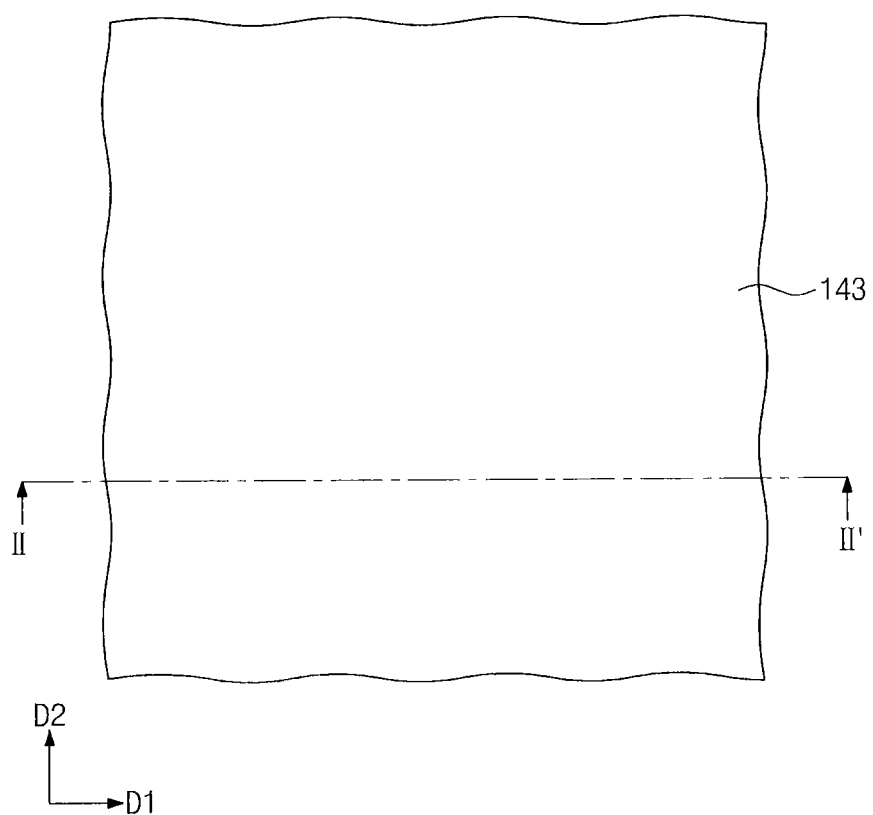
Figure 13B:
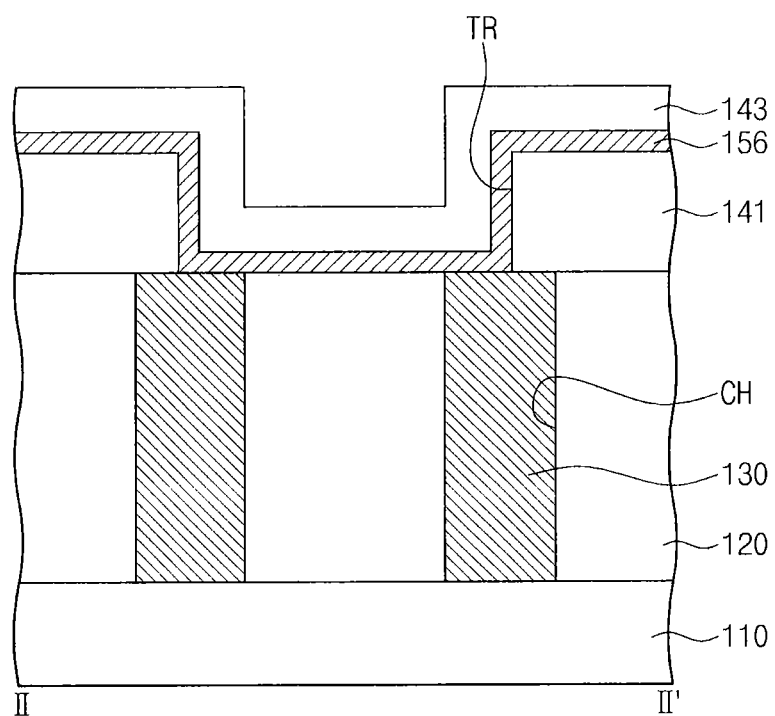

Referring to FIGS. 13A and 13B, the third lower insulating layer 143 may be formed to conformally cover the resulting structure of FIGS. 12A and 12B. The third lower insulating layer 143 may include at least one of silicon oxide, silicon nitride, or silicon oxynitride and may have an amorphous structure.

Figure 14A:
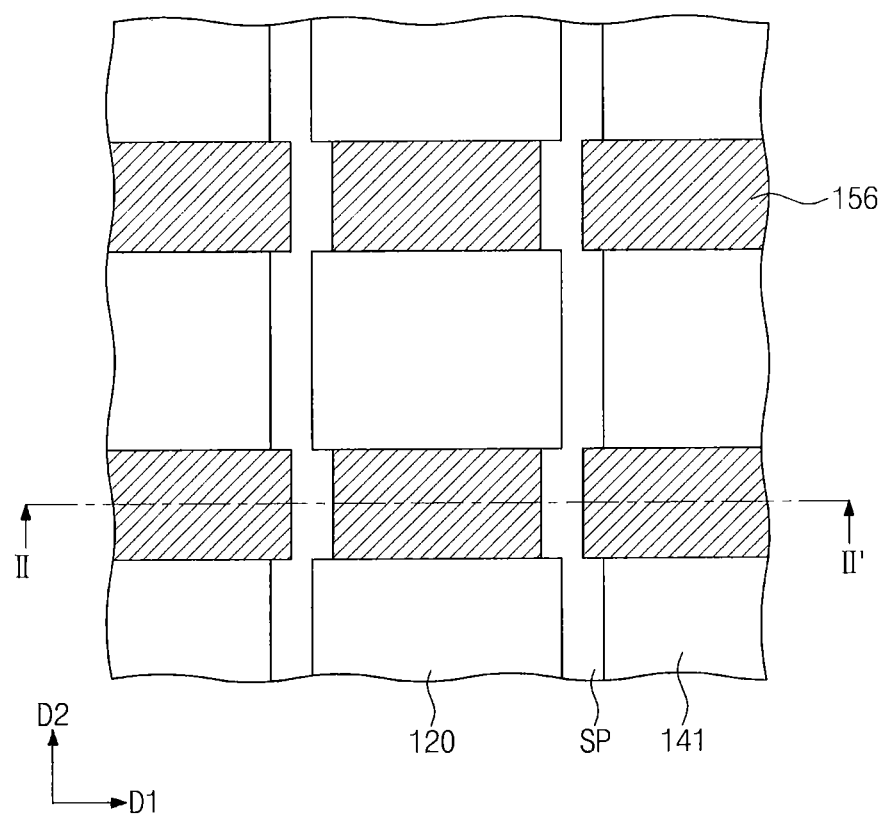
Figure 14B:
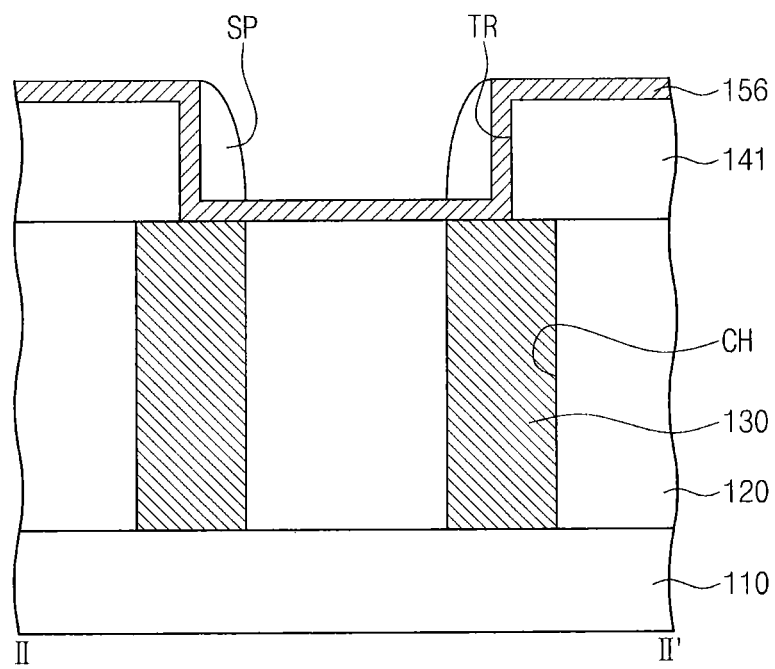

Referring to FIGS. 14A and 14B, the third lower insulating layer 143 may be partially etched to form a pair of spacers SP covering the conductive layer 156 along a sidewall of the trench TR. In some example embodiments, the formation of the spacers SP may include anisotropically etching the third lower insulating layer 143. The pair of the spacers SP may be formed on sidewalls of the trench TR. Each of the spacers SP may extend along the sidewall of the trench TR or in the second direction D2.

Figure 15A:
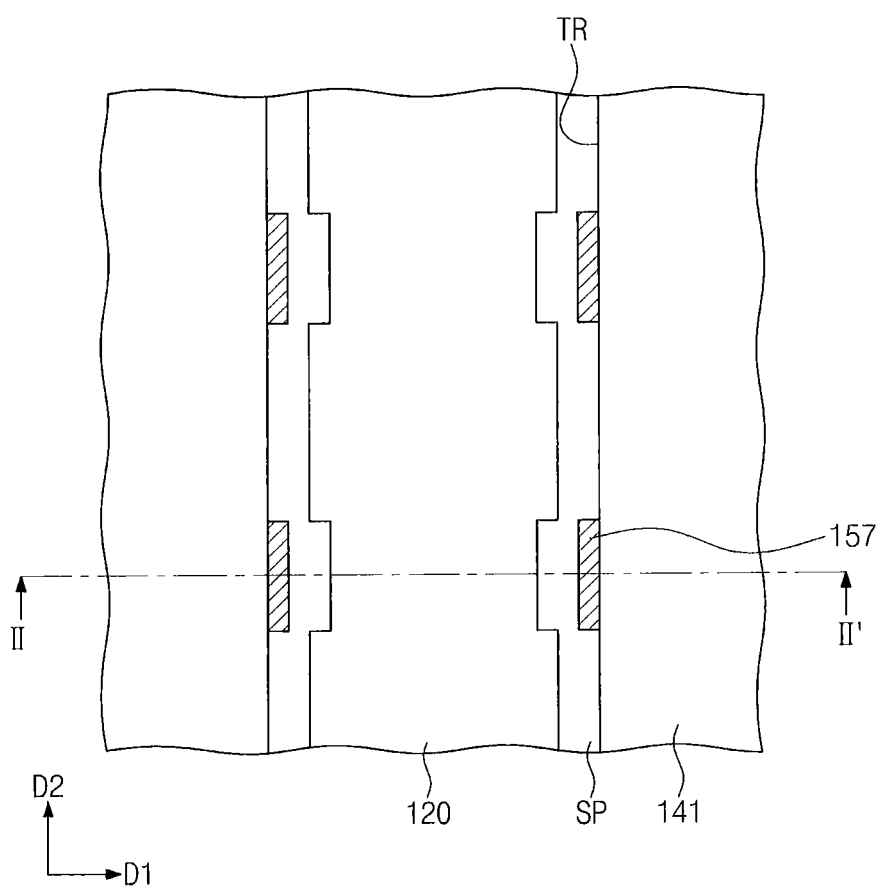
Figure 15B:
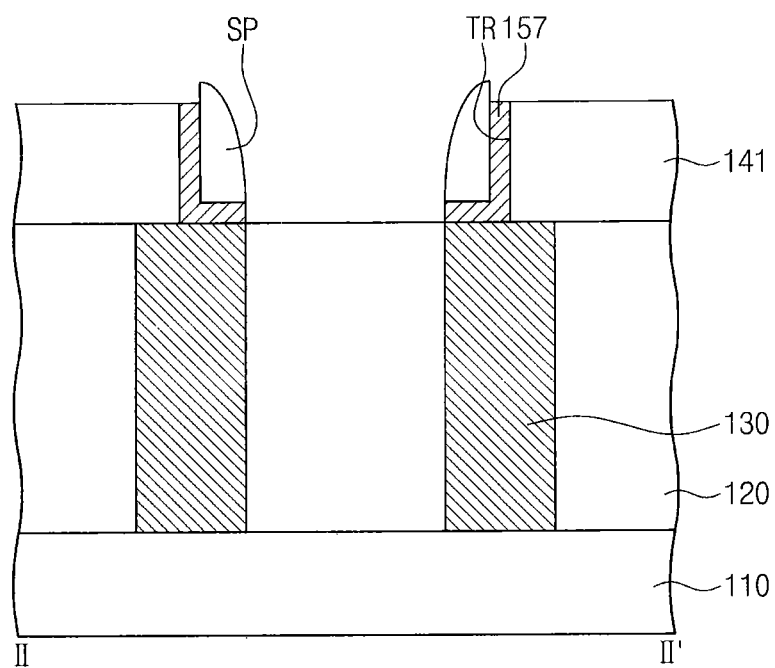

Referring to FIGS. 15A and 15B, the conductive pattern 156 may be etched using the spacers SP as an etch mask to form a pair of preliminary lower electrodes 157. The preliminary lower electrodes 157 may be formed on the lower contacts 130, respectively, and spaced apart from each other. The pair of the preliminary lower electrodes 157 may have "L"-shaped sections facing each other.

Figure 16A:
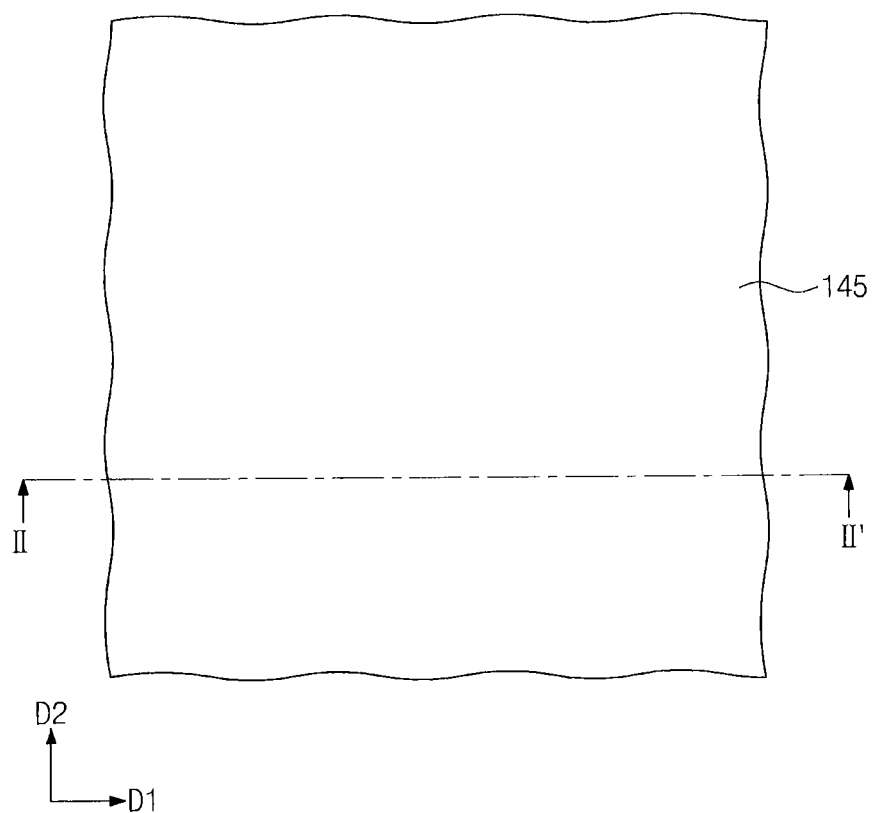
Figure 16B:
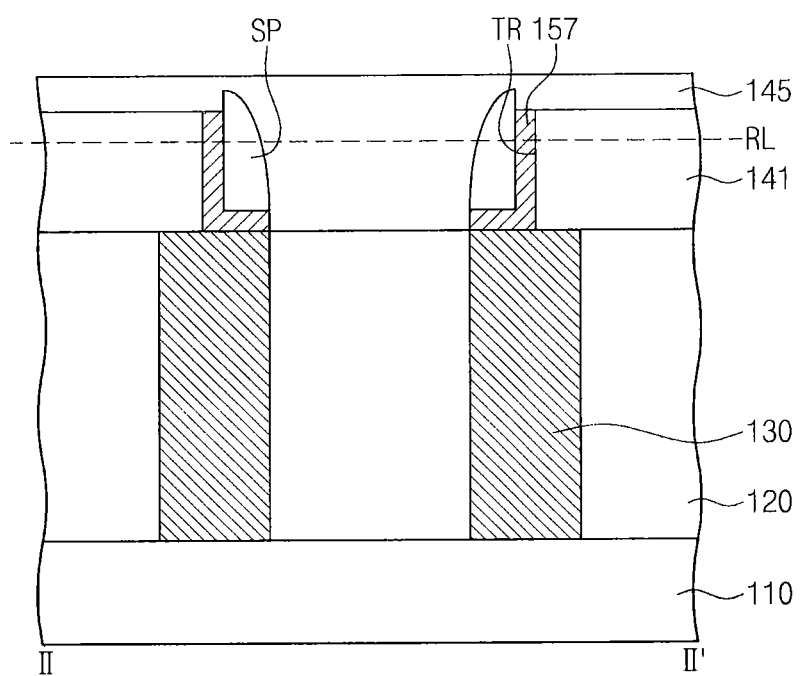

Referring to FIGS. 16A and 16B, a fourth lower insulating layer 145 may be formed to cover the resulting structure of FIGS. 15A and 15B. The fourth lower insulating layer 145 may include at least one of silicon oxide, silicon nitride, or silicon oxynitride and may have an amorphous structure.

Figure 17A:
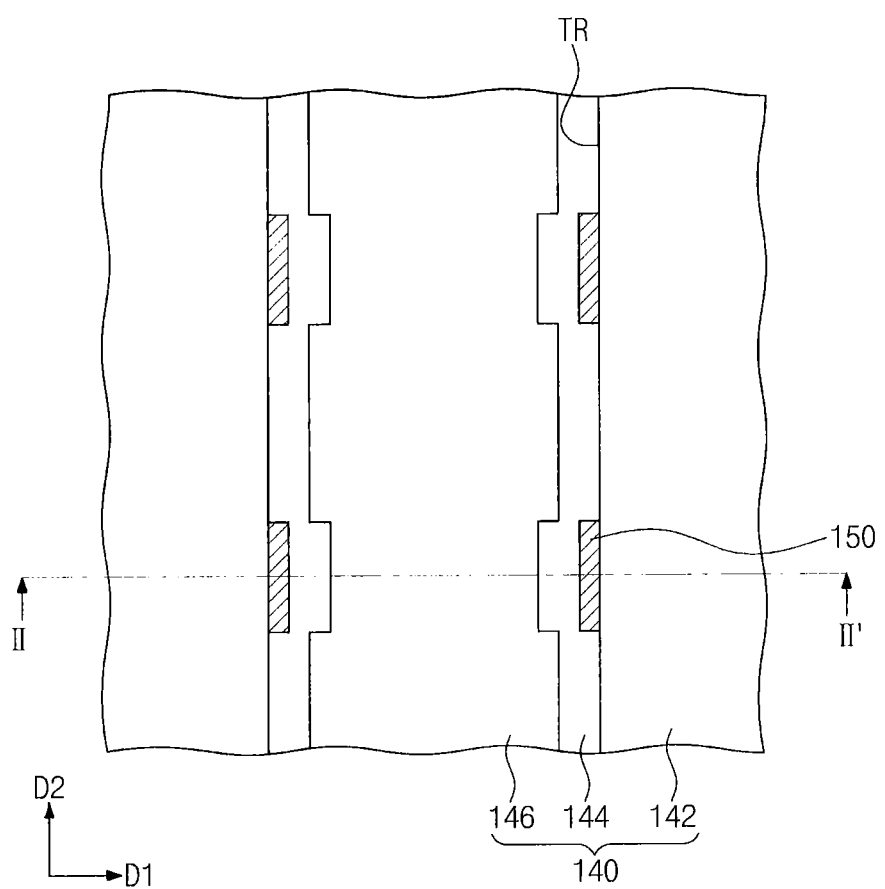
Figure 17B:
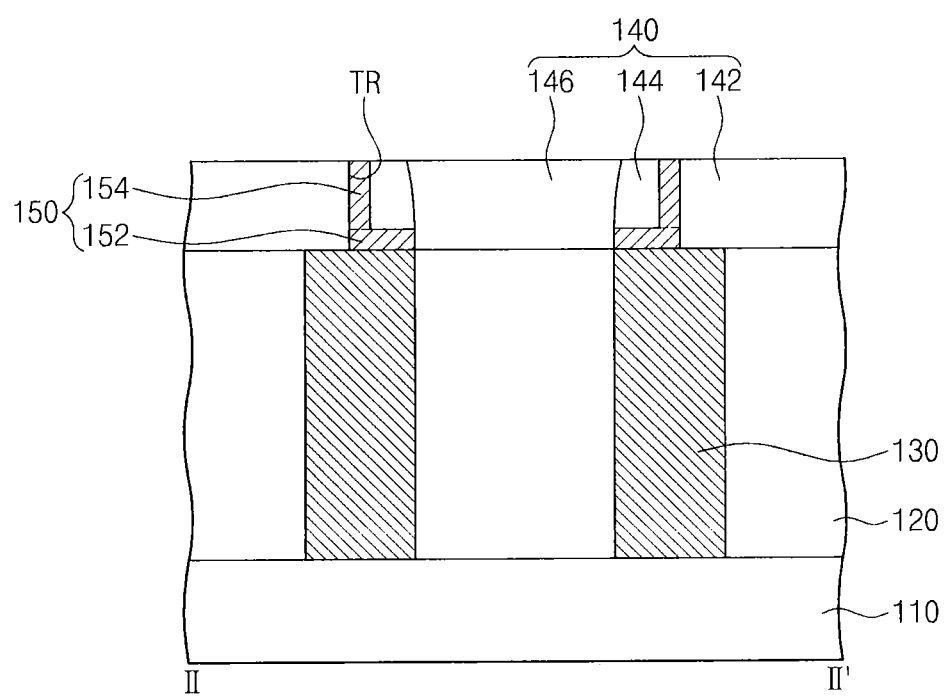

Referring to FIGS. 17A and 17B, a planarization process may be performed until the preliminary lower electrode 157 is at least exposed, and thus, the first insulating pattern 142, the second insulating patterns 144, a third insulating pattern 146, and the lower electrodes 150 may be formed. In example embodiments, the planarization process may be performed on the second lower insulating layer 141, the spacers SP, the fourth lower insulating layer 145, and the preliminary lower electrodes 157, using a chemical mechanical polishing (CMP) process. Top surfaces of the first insulating pattern 142, the second insulating pattern 144, the third insulating pattern 146, and the lower electrodes 150 are positioned at or below the reference level RL shown in FIG. 16B. The first insulating pattern 142, the second insulating pattern 144, and the third insulating pattern 146 may constitute the insulating structure 140. The lower electrode 150, the first insulating pattern 142, the second insulating pattern 144, and the third insulating pattern 146 may have top surfaces coplanar with each other. The top surface of the first insulating pattern 142, the second insulating patterns 144, and/or the third insulating pattern 146 may have a lesser (e.g., smoother) roughness than that of the top surface of the lower electrodes 150.

The lower electrodes 150 may be formed from the preliminary lower electrodes 157. Accordingly, each of the lower electrodes 150 may include the bottom portion 152 covering the bottom surface of the trench TR and the protruding portion 154 upwardly extending from a top surface of the bottom portion 152 along the sidewall of the trench TR. In other words, the lower electrodes 150 may be spaced apart from each other and may have an "L"-shaped section.

The first insulating pattern 142 may be formed from the second lower insulating layer 141. Accordingly, the first insulating pattern 142 may also have the trench TR, in which the lower electrodes 150 are provided.

The second insulating patterns 144 may be formed from the spacers SP. The second insulating patterns 144 may be formed on the bottom portion 152 of the lower electrodes 150 to cover a side surface of the protruding portion 154.

The third insulating pattern 146 may be formed from the fourth lower insulating layer 145. The third insulating pattern 146 may be located between spaced-apart ones of the second insulating patterns 144.

Figure 18A:
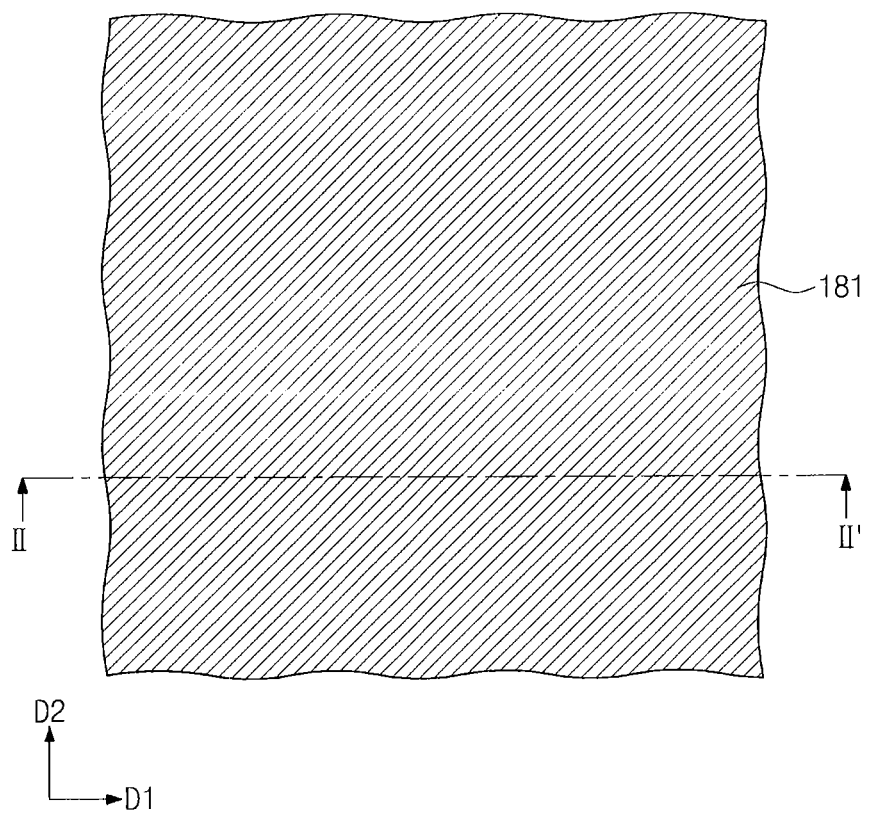
Figure 18B:
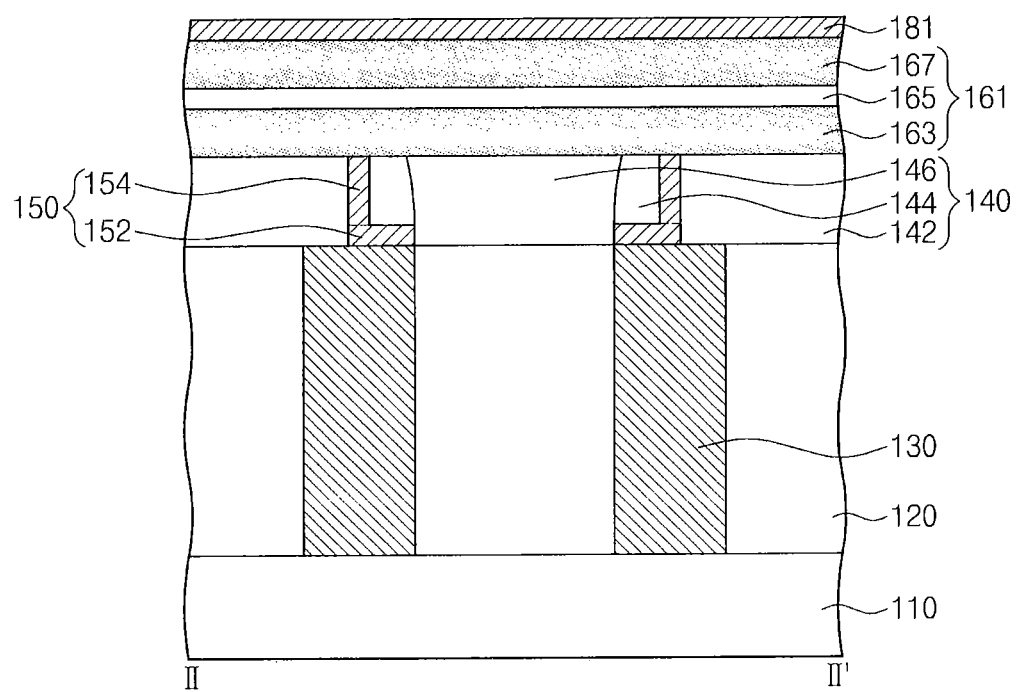

Referring to FIGS. 18A and 18B, the MTJ-layer stack 161 and the conductive layer 181 may be sequentially formed on the insulating structure 140. The formation of the MTJ-layer stack 161 may include sequentially forming the first magnetic layer 163, the tunnel barrier layer 165, and the second magnetic layer 167 on the insulating structure 140. The conductive layer 181 may include at least one of metals (e.g., tungsten, copper, or aluminum), conductive metal nitrides (e.g., titanium nitride or tantalum nitride), or transition metals (e.g., titanium or tantalum). In some embodiments, an additional conductive layer may be formed before the formation of the MTJ-layer stack 161. The additional conductive layer may include at least one of metals (e.g., tungsten, copper, or aluminum), conductive metal nitrides (e.g., titanium nitride or tantalum nitride), or transition metals (e.g., titanium or tantalum). Alternatively, the formation of the additional conductive layer may be omitted.

Figure 19A:
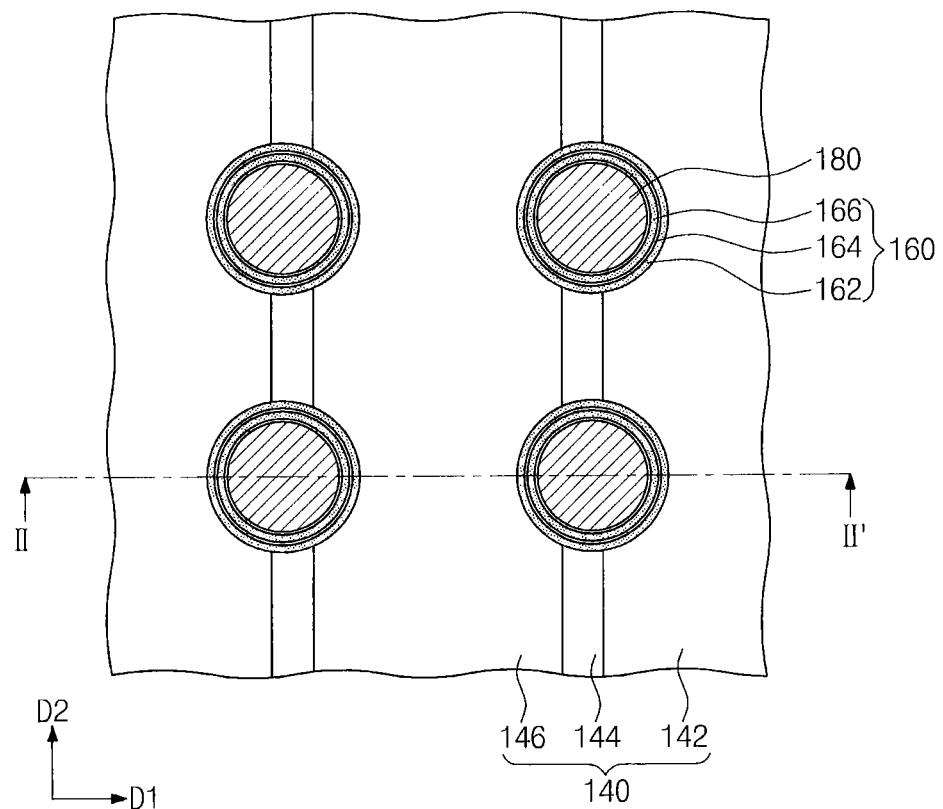
Figure 19B:
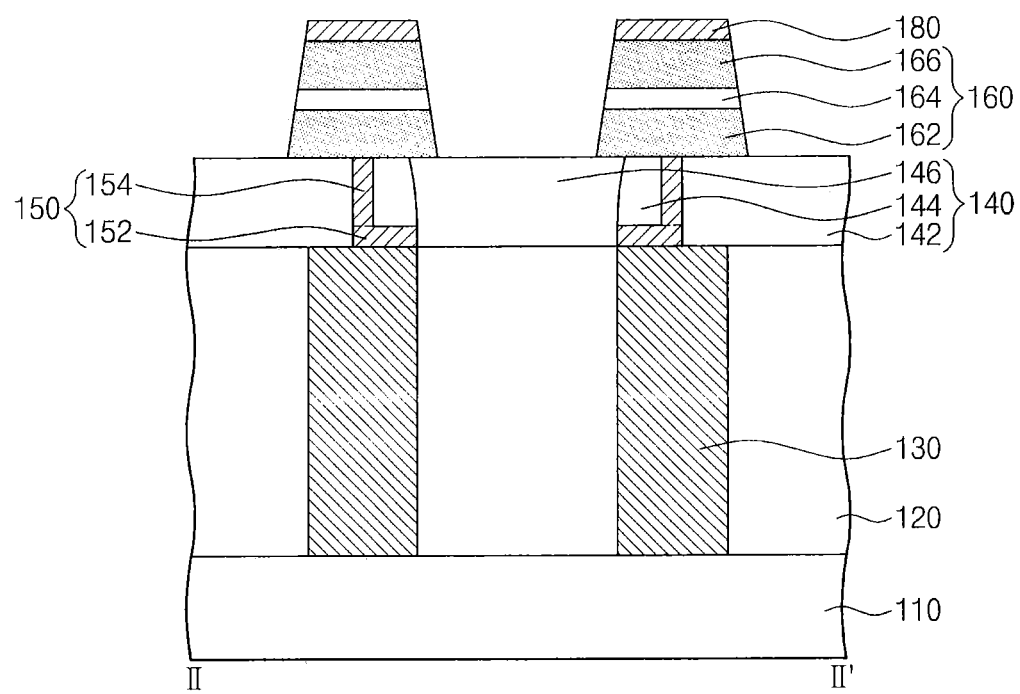

Referring to FIGS. 19A and 19B, the MTJ-layer stack 161 and the conductive layer 181 may be patterned to form the magnetic tunnel junction pattern 160 and the upper electrode 180. As an example, the formation of the magnetic tunnel junction pattern 160 may include patterning the MTJ-layer stack 161 using the upper electrode 180 as an etch mask. In the case where an additional conductive layer is formed, the additional conductive layer may be patterned along with the MTJ-layer stack 161, when the MTJ-layer stack 161 is patterned. In this case, an additional lower electrode may be formed.

The magnetic tunnel junction pattern 160 may be in contact with at least a portion of the first insulating pattern 142, at least a portion of the second insulating pattern 144, and at least a portion of the lower electrode 150. In some embodiments, the magnetic tunnel junction pattern 160 may also be in contact with a portion of the third insulating pattern 146. A contact area between the magnetic tunnel junction pattern 160 and the top surface of the insulating structure 140 may be greater than that between the magnetic tunnel junction pattern 160 and the top surface of the protruding portion 154.

A root-mean-square roughness of the top surfaces of the insulating structure 140 and the lower electrode 150 in contact with the magnetic tunnel junction pattern 160 may range from about 0.01 nm to about 1 nm.

The magnetic tunnel junction pattern 160 may include the first magnetic pattern 162, the tunnel barrier pattern 164, and the second magnetic pattern 166, which are sequentially stacked on the lower electrode 150. Each of the first magnetic pattern 162, the tunnel barrier pattern 164, and the second magnetic pattern 166 may have its own crystal structure. The crystal structure of the magnetic tunnel junction pattern 160 may be affected by a layer in contact with the magnetic tunnel junction pattern 160. For example, the crystal structure of the magnetic tunnel junction pattern 160 may be improved, when the contacting layer has a smaller/smoother/lesser roughness. As another example, the magnetic tunnel junction pattern 160 may have a more desirable crystal structure when the contacting layer has an amorphous structure than when the contacting layer has a crystalline structure. Materials and data storing mechanism(s) of the magnetic tunnel junction pattern 160 will be described in detail with reference to FIGS. 20 and 21.

According to method(s) of fabricating the magnetic memory device 101 as illustrated in FIGS. 9A-19B, the magnetic tunnel junction pattern 160 may be formed to have a larger contact area with the top surface of the insulating structure 140 than with that of the lower electrode 150. Here, the roughness of the top surface of the insulating structure 140 may be smaller than that of the top surface of the lower electrode 150. This may make it possible to improve the crystal structure of the magnetic tunnel junction pattern 160. Further, the insulating structure 140 may have an amorphous structure, whereas the lower electrode 150 may have a poly-crystalline structure. This may make it possible to further improve the crystal structure of the magnetic tunnel junction pattern 160.

In some cases, there may be misalignment between the magnetic tunnel junction pattern 160 and the lower electrode 150, and in such cases, the lower electrode 150 may be partially exposed. According to example embodiments of present inventive concepts, an exposed top surface of the lower electrode 150 may have a small area, even when there is the misalignment between the magnetic tunnel junction pattern 160 and the lower electrode 150. This may make it possible to reduce re-deposition of the lower electrode 150 and consequently to suppress an electrical short circuit from being formed between the magnetic patterns 162 and 166 of the magnetic tunnel junction pattern 160.

Referring back to FIGS. 2A and 2B, the upper insulating layer 170, the upper contact 182, and the bit line 184 may be formed.

The upper insulating layer 170 may be formed to cover the insulating structure 140 provided with the magnetic tunnel junction pattern 160. The upper insulating layer 170 may include at least one of silicon oxide, silicon nitride, or silicon oxynitride.

The upper contact 182 may be formed to penetrate the upper insulating layer 170 and may be electrically connected to the upper electrode 180. The bit line 184 may be formed on the upper insulating layer 170 and may be electrically connected to the upper contact 182. The upper contact 182 and the bit line 184 may include at least one of metals (e.g., tungsten, copper, or aluminum), conductive metal nitrides (e.g., titanium nitride or tantalum nitride), or transition metals (e.g., titanium or tantalum).

Figure 20:
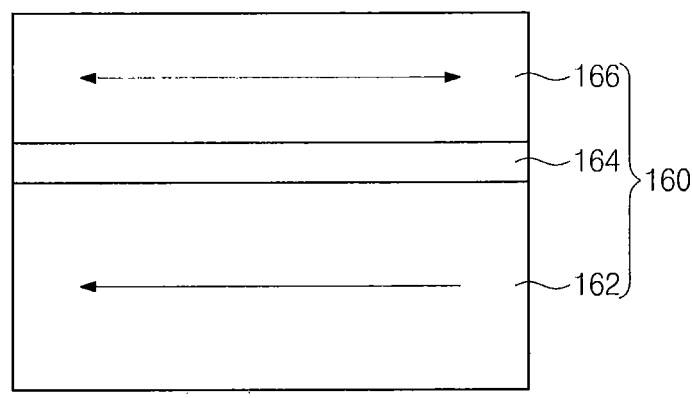
FIG. 20 is a schematic diagram illustrating a magnetic tunnel junction pattern according to example embodiments of present inventive concepts.

FIG. 20 is a schematic diagram illustrating a magnetic tunnel junction pattern according to example embodiments of present inventive concepts. As illustrated in FIG. 20, the magnetic tunnel junction pattern 160 may include the first magnetic pattern 162, the tunnel barrier pattern 164, and the second magnetic pattern 166. One of the first and second magnetic patterns 162 and 166 may serve as the free layer of the magnetic tunnel junction, and the other may serve as a fixed layer of the magnetic tunnel junction. For the sake of simplicity, the description that follows will refer to an example in which the first and second magnetic patterns 162 and 166 are used as fixed and free layers, respectively, but in some embodiments, the first and second magnetic patterns 162 and 166 may be used as the free and fixed layers, respectively. The magnetic tunnel junction pattern 160 may have an electrical resistance varying depending on magnetization directions of the free and fixed layers. For example, the electrical resistance of the magnetic tunnel junction pattern 160 may be much higher when magnetization directions of the free and fixed layers are anti-parallel than when they are parallel. As a result, the electrical resistance of the magnetic tunnel junction pattern 160 can be controlled by changing a magnetization direction of the free layer, and this may be used as data storing mechanism(s) in the magnetic memory device according to example embodiments of present inventive concepts.

In example embodiments, the first and second magnetic patterns 162 and 166 may be configured to have an in-plane magnetization structure; for example, each of them may include at least one magnetic layer, whose magnetization direction is substantially parallel to a top surface of the tunnel barrier/insulating pattern 164. In some embodiments, the first magnetic pattern 162 may include two layers, one of which includes an antiferromagnetic material, and the other of which includes a ferromagnetic material. The layer including the antiferromagnetic material may include at least one of platinum manganese (PtMn), iridium manganese (IrMn), manganese oxide (MnO), manganese sulfide (MnS), manganese telluride (MnTe), manganese fluoride ($MnF_2$), iron chloride ($FeCl_2$), iron oxide (FeO), cobalt chloride ($CoCl_2$), cobalt oxide (CoO), nickel chloride ($NiCl_2$), nickel oxide (NiO), or chromium (Cr). In some embodiments, the layer including the antiferromagnetic material may include at least one of precious metals. The precious metals may include ruthenium (Ru), rhodium (Rh), palladium (Pd), osmium (Os), iridium (Ir), platinum (Pt), gold (Au), or silver (Ag). The layer including the ferromagnetic material may include at least one of cobalt iron boron (CoFeB), iron (Fe), cobalt (Co), nickel (Ni), gadolinium (Gd), dysprosium (Dy), cobalt iron (CoFe), nickel iron (NiFe), manganese arsenide (MnAs), manganese bismuth (MnBi), manganese antimonide (MnSb), chromium oxide ($CrO_2$), $MnOFe_2O_3$, $FeOFe_2O_3$, $NiOFe_2O_3$, $CuOFe_2O_3$, $MgOFe_2O_3$, europium oxide (EuO), or yttrium iron garnet ($Y_3Fe_5O_{12}$).

The second magnetic pattern 166 may be configured to have a variable or switchable magnetization direction. As an example, the second magnetic pattern 166 may include a ferromagnetic material. For example, the second magnetic pattern 166 may include at least one selected from the group consisting of FeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO and $Y_3Fe_5O_{12}$.

The second magnetic pattern 166 may include a plurality of layers. For example, the second magnetic pattern 166 may include a plurality of ferromagnetic layers and at least one non-magnetic layer interposed between the ferromagnetic layers. In this case, the ferromagnetic layers and the non-magnetic layer may constitute a synthetic antiferromagnetic layer. The synthetic antiferromagnetic layer may make it possible to reduce a critical current density of the magnetic memory device and improve a thermal stability of the magnetic memory device.

The tunnel barrier pattern 164 may include at least one of magnesium oxide, titanium oxide, aluminum oxide, magnesium-zinc oxide, magnesium-boron oxide, titanium nitride, or vanadium nitride. For example, the tunnel barrier pattern 164 may be a single layer of magnesium oxide (MgO). Alternatively, the tunnel barrier pattern 164 may include a plurality of layers. The tunnel barrier pattern 164 may be formed by a chemical vapor deposition process.

Figure 21:
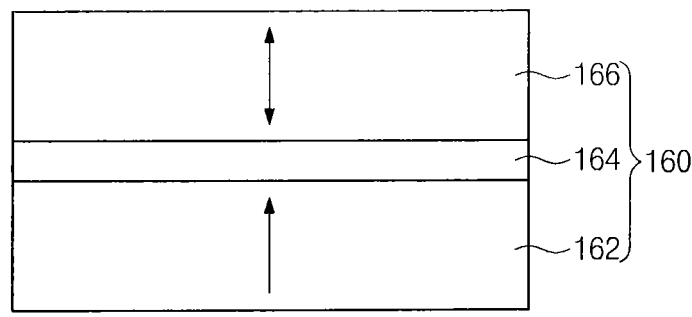
FIG. 21 is a schematic diagram illustrating a magnetic tunnel junction pattern according to example embodiments of present inventive concepts.

FIG. 21 is a schematic diagram illustrating a magnetic tunnel junction pattern according to some example embodiments. As illustrated in FIG. 21, the first and second magnetic patterns 162 and 166 may be configured to have a perpendicular magnetization structure; for example, each of them may include at least one magnetic layer, whose magnetization direction is substantially normal/perpendicular to the top surface of the tunnel barrier pattern 164. In some embodiments, the first and second magnetic patterns 162 and 166 may include at least one of materials with an $L1_0$ crystal structure, materials having a hexagonal closed packed structure, or amorphous rare-earth transition metal (RE-TM) alloys. For example, the first and second magnetic patterns 162 and 166 may include at least one of materials having an $L1_0$ structure, such as Fe50Pt50, Fe50Pd50, Co50Pt50, Co50Pd50, and Fe50Ni50. In some embodiments, the first and second magnetic patterns 162 and 166 may include at least one of cobalt-platinum (CoPt) disordered hexagonal-close-packed (HCP) alloys having a platinum content of 10 to 45 at. % or Co3Pt ordered HCP alloys. In some embodiments, the first and second magnetic patterns 162 and 166 may include at least one of the amorphous RE-TM alloys containing at least one of iron (Fe), cobalt (Co), or nickel (Ni) and at least one of rare-earth metals such as terbium (Tb), dysprosium (Dy), and gadolinium (Gd).

At least one of the first and second magnetic patterns 162 and 166 may include a material exhibiting an interface perpendicular magnetic anisotropy. The interface perpendicular magnetic anisotropy may refer to a perpendicular magnetization phenomenon, which may be seen at an interface of a magnetic layer with an intrinsically in-plane magnetization property, when the magnetic layer is in contact with another layer. Here, the term "intrinsic in-plane magnetization property" will be used to mean that a magnetization direction of a magnetic layer is oriented parallel to a longitudinal direction thereof, when there is no external magnetic field applied thereto. For example, in the case that a magnetic layer with the intrinsic in-plane magnetization property is formed on a substrate and there is no external magnetic field applied thereto, a magnetization direction of the magnetic layer may be oriented substantially parallel to the top surface of the substrate.

In example embodiments, the first and second magnetic patterns 162 and 166 may include at least one of cobalt (Co), iron (Fe), or nickel (Ni). The first and second magnetic patterns 162 and 166 may further include at least one of non-magnetic materials including boron (B), zinc (Zn), aluminum (Al), titanium (Ti), ruthenium (Ru), tantalum (Ta), silicon (Si), silver (Ag), gold (Au), copper (Cu), carbon (C), and nitrogen (N). As an example, the first and second magnetic patterns 162 and 166 may include a layer of CoFe or NiFe, in which boron (B) is added. Furthermore, at least one of the first and second magnetic patterns 162 and 166 may further include at least one of titanium (Ti), aluminum (Al), magnesium (Mg), tantalum (Ta), or silicon (Si) to lower saturation magnetization thereof. The first and second magnetic patterns 162 and 166 may be formed by a sputtering or plasma-enhanced chemical vapor deposition (PECVD) process.

Figure 22:
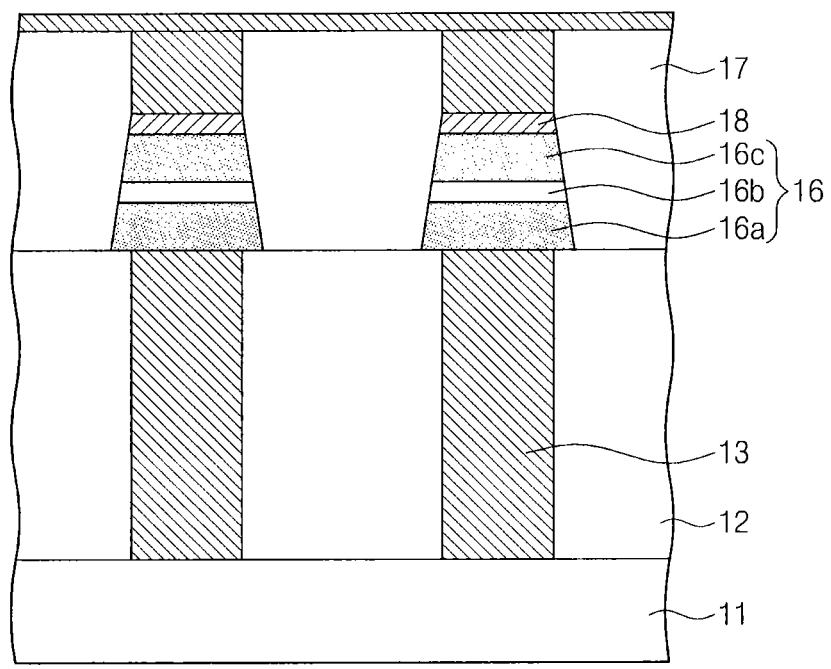
FIG. 22 is a sectional view illustrating a conventional magnetic memory device.

FIG. 22 is a sectional view illustrating a conventional magnetic memory device. Referring to FIG. 22, a conventional magnetic memory device 10 may include a substrate 11, a lower insulating layer 12, a lower contact 13, a magnetic tunnel junction pattern 16, an upper insulating layer 17, and an upper electrode 18. The lower insulating layer 12 may be provided on the substrate 11, and the lower contact 13 may penetrate the lower insulating layer 12. The magnetic tunnel junction pattern 16 may include a first magnetic pattern 16a, a tunnel barrier pattern 16b, and a second magnetic layer 16c that are stacked sequentially. The upper electrode 18 may be provided on the magnetic tunnel junction pattern 16. The upper insulating layer 17 may be provided on the lower insulating layer 12 to cover the magnetic tunnel junction pattern 16.

In the conventional magnetic memory device 10, the magnetic tunnel junction pattern 16 may be provided directly on the lower contact 13. A top surface of underlying layer(s) (e.g., the lower contact 13 and the lower insulating layer 12) in contact with the magnetic tunnel junction pattern 16 may have a root-mean-square roughness ranging from about 1 nm to about 3 nm. Accordingly, for the magnetic memory devices (e.g., 100 and 101 of FIGS. 1A and 2A) according to example embodiments of present inventive concepts, underlying layer(s) in contact with the magnetic tunnel junction pattern 160 may have a roughness (e.g., a combined roughness) lower/smoother/lesser than that of the conventional magnetic memory device 10. This is because a contact area between the magnetic tunnel junction pattern 160 and the lower electrode 150 of the magnetic memory devices 100 and 101 of FIGS. 1A and 2A is smaller than that between the magnetic tunnel junction pattern 16 and the lower contact 13 of the conventional magnetic memory device 10. Accordingly, the magnetic tunnel junction pattern 160, which is included in the magnetic memory device according to example embodiments of present inventive concepts, can have an improved crystal structure, compared with the magnetic tunnel junction pattern 16 of the conventional magnetic memory device 10.

Figure 23:
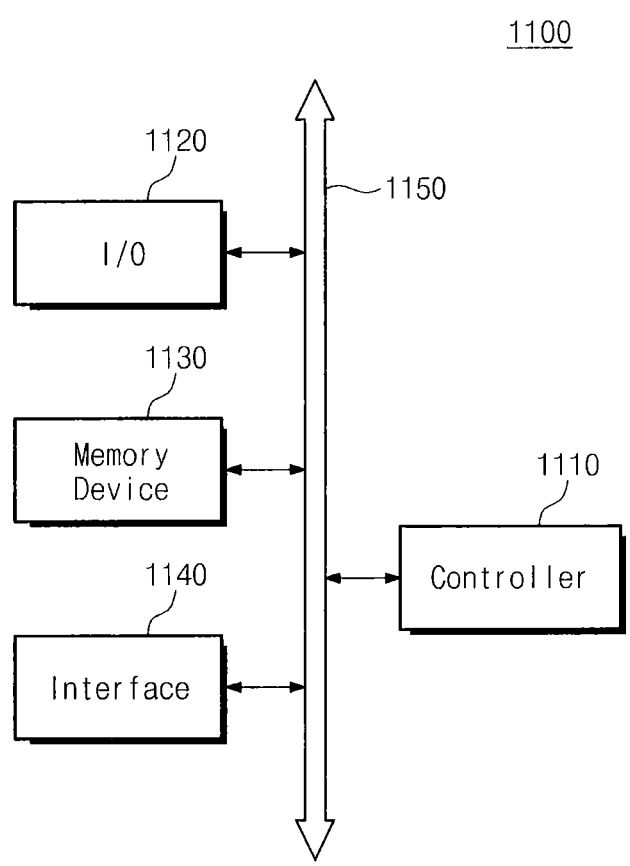
FIG. 23 is a schematic block diagram illustrating an example of electronic systems including a magnetic memory device according to example embodiments of present inventive concepts.

FIG. 23 is a schematic block diagram illustrating an example of electronic systems including a magnetic memory device according to example embodiments of present inventive concepts.

Referring to FIG. 23, an electronic system 1100 according to example embodiments of present inventive concepts may include a controller 1110, an input/output (I/O) unit 1120, a memory device 1130, an interface unit 1140, and a data bus 1150. At least two of the controller 1110, the I/O unit 1120, the memory device 1130 and the interface unit 1140 may communicate with each other via the data bus 1150. The data bus 1150 may correspond to a path through which electrical signals are transmitted.

The controller 1110 may include at least one of a microprocessor, a digital signal processor, a microcontroller or another logic device, which is configured to have a similar function thereto. The I/O unit 1120 may include a keypad, a keyboard, or a display unit. The memory device 1130 may store data and/or commands. The memory device 1130 may include one of the magnetic memory devices 100, 101 according to various embodiments of present inventive concepts. The interface unit 1140 may transmit electrical data to a communication network or may receive electrical data from a communication network. The interface unit 1140 may operate in wireless or wired manner. For example, the interface unit 1140 may include an antenna for wireless communication or a transceiver for wireless or wired communication. In some embodiments, the electronic system 1100 may further include a fast DRAM or SRAM device that acts as a cache memory for improving an operation of the controller 1110.

The electronic system 1100 may be applied to a personal digital assistant (PDA), a portable computer, a web tablet, a wireless phone, a mobile phone, a digital music player, a memory card, or any electronic product/device that is configured to receive or transmit information data in a wireless manner.

Figure 24:
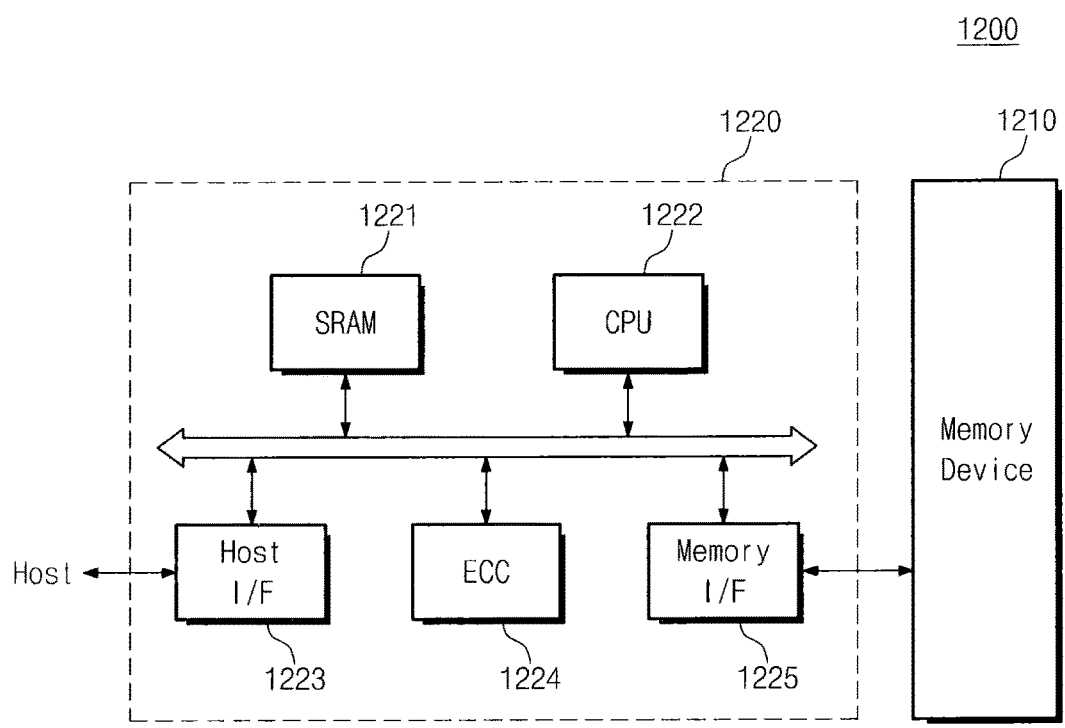
FIG. 24 is a schematic block diagram illustrating an example of memory cards including a magnetic memory device according to example embodiments of present inventive concepts.

FIG. 24 is a schematic block diagram illustrating an example of memory cards including a magnetic memory device according to example embodiments of present inventive concepts.

Referring to FIG. 24, a memory card 1200 according to example embodiments of present inventive concepts may include a memory device 1210. The memory device 1210 may include one of the magnetic memory devices 100, 101 according to various embodiments of present inventive concepts. The memory card 1200 may include a memory controller 1220 that controls data communication between a host and the memory device 1210.

The memory controller 1220 may include a processing unit (e.g., a central processing unit (CPU)) 1222 that controls overall operations of the memory card 1200. In addition, the memory controller 1220 may include an SRAM device 1221 used as an operation/operating memory of the processing unit 1222. Moreover, the memory controller 1220 may further include a host interface (I/F) unit 1223 and a memory interface (I/F) unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. In some embodiments, the memory card 1200 may further include a read only memory (ROM) device that stores code data to interface with the host. The memory card 1200 may be used as a portable data storage card. Alternatively, the memory card 1200 may include a solid state drive (SSD), instead of a hard disk.

According to example embodiments of present inventive concepts, a magnetic memory device may include a magnetic tunnel junction pattern having a bottom surface in main/primary contact with an insulating structure. In other words, a higher percentage of the bottom surface may contact the insulating structure than contact a lower electrode. The insulating structure may be formed to have an amorphous structure and have a top surface with higher/greater flatness/smoothness than that of the lower electrode, and this may make it possible to improve a crystal structure of the magnetic tunnel junction pattern. Accordingly, the magnetic memory device can have an improved magnetic property.

According to example embodiments of present inventive concepts, it may be possible to reduce a contact area between the magnetic tunnel junction pattern and the lower electrode, and this may make it possible to increase a contact resistance between the magnetic tunnel junction pattern and the lower electrode. Such an increase in contact resistance between the magnetic tunnel junction pattern and the lower electrode may make it possible to locally increase a temperature of the magnetic tunnel junction pattern and thereby to switch the magnetization direction of the free layer with relative ease.

In some cases, there may be misalignment between the magnetic tunnel junction pattern and the lower electrode, and in such cases, the lower electrode may be partially exposed. According to example embodiments of present inventive concepts, an exposed top surface of the lower electrode may have a small area, even when there is the misalignment between the magnetic tunnel junction pattern and the lower electrode. This may make it possible to reduce re-deposition of the lower electrode and consequently to suppress an electrical short circuit from being formed between the magnetic patterns constituting the magnetic tunnel junction pattern.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A magnetic memory device, comprising:
a lower insulating layer on a substrate;
an insulating structure on the lower insulating layer;
a lower contact in the lower insulating layer;
a lower electrode in the insulating structure and electrically connected to the lower contact; and
a magnetic tunnel junction pattern in contact with at least a portion of a top surface of the insulating structure and at least a portion of a top surface of the lower electrode,
wherein the lower electrode comprises a bottom portion and a protruding portion protruding from a top surface of the bottom portion toward the magnetic tunnel junction pattern,
wherein at least a portion of the top surface of the bottom portion of the lower electrode is in contact with the insulating structure.

2. The device of claim 1, wherein a first contact area between the magnetic tunnel junction pattern and the top surface of the insulating structure is larger than a second contact area between the magnetic tunnel junction pattern and the top surface of the lower electrode.

3. The device of claim 1, wherein the bottom portion of the lower electrode is spaced apart from the magnetic tunnel junction pattern.

4. The device of claim 1, wherein the insulating structure comprises an amorphous structure.

5. The device of claim 4, wherein the lower electrode comprises a polycrystalline structure.

6. The device of claim 1, wherein a first roughness of the top surface of the insulating structure is less rough than a second roughness of a top surface of the protruding portion of the lower electrode.

7. The device of claim 1, wherein the protruding portion of the lower electrode comprises a top surface coplanar with the top surface of the insulating structure.

8. A magnetic memory device, comprising:
a lower insulating layer on a substrate;
a lower contact in the lower insulating layer;
a first insulating pattern on the lower insulating layer and comprising a gap overlying the lower contact;
a lower electrode in the gap, on the lower contact and on a side surface of the first insulating pattern;
a second insulating pattern in the gap, on the lower electrode; and
a magnetic tunnel junction pattern in contact with at least a portion of a top surface of each of the lower electrode, the first insulating pattern, and the second insulating pattern.

9. The device of claim 8,
wherein the first and second insulating patterns define an insulating structure, and
wherein a first contact area between the magnetic tunnel junction pattern and a top surface of the insulating structure is larger than a second contact area between the magnetic tunnel junction pattern and the top surface of the lower electrode.

10. The device of claim 8, wherein at least one of the first and second insulating patterns comprises an amorphous structure.

11. The device of claim 10, wherein the lower electrode comprises a polycrystalline structure.

12. The device of claim 8, wherein a roughness of the top surface of each of the first and second insulating patterns is less rough than a roughness of the top surface of the lower electrode.

13. The device of claim 8, wherein the top surface of the lower electrode is coplanar with the top surfaces of the first and second insulating patterns.

14. The device of claim 8, wherein the lower electrode comprises a closed-bottom hollow cylinder shape.

15. A magnetic memory device comprising:
first and second contacts;
a Magnetic Tunnel Junction (MTJ) structure between the first and second contacts, the MTJ structure comprising a tunnel barrier layer between first and second magnetic layers;
an insulating structure between the MTJ structure and one of the first and second contacts; and
an electrode between the MTJ structure and the one of the first and second contacts,
wherein a first contact area of the electrode with the MTJ structure is smaller than a second contact area of the insulating structure with the MTJ structure,
wherein the electrode includes a base portion and a protruding portion protruding from the base portion toward the MTJ structure, and
wherein the electrode contacts the one of the first and second contacts with a third contact area that is larger than the first contact area.

16. The magnetic memory device of claim 15,
wherein the protruding portion has a hollow cylinder shape, and
wherein the insulating structure comprises a portion that fills a gap region of the hollow cylinder shape.

17. The magnetic memory device of claim 15, wherein the electrode has a "L"-shaped vertical section.

18. The magnetic memory device of claim 15, wherein the insulating structure contacts the MTJ structure and the one of the first and second contacts.

19. The magnetic memory device of claim 15, further comprising a substrate, wherein:
the one of the first and second contacts is on the substrate; and
the third contact area, of the electrode with the one of the first and second contacts, is closer than the first contact area, of the electrode with the MTJ structure, to the substrate.

20. The magnetic memory device of claim 15, wherein:
a surface of the electrode that contacts the MTJ structure is rougher than a surface of the insulating structure that contacts the MTJ structure;
the electrode comprises a polycrystalline structure;
the insulating structure comprises an amorphous structure; and
the MTJ structure and the electrode are misaligned such that a portion of the electrode laterally extends beyond a side surface of the MTJ structure.

* * * * *